(12) United States Patent  
Tobita

(10) Patent No.: US 7,372,300 B2
(45) Date of Patent: May 13, 2008

(54) SHIFT REGISTER AND IMAGE DISPLAY APPARATUS CONTAINING THE SAME

(75) Inventor: Youichi Tobita, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/614,384

(22) Filed: Dec. 21, 2006

(65) Prior Publication Data

US 2007/0164973 A1 Jul. 19, 2007

(30) Foreign Application Priority Data

Jan. 5, 2006 (JP) ............................. 2006-000390

(51) Int. Cl.
*G09G 3/36* (2006.01)
*H03K 19/173* (2006.01)

(52) U.S. Cl. ........................................ 326/46; 345/100

(58) Field of Classification Search ................. 326/37, 326/38, 46, 82, 83, 86, 93–98; 345/100, 345/197
See application file for complete search history.

(56) References Cited

U.S. PATENT DOCUMENTS

| 4,063,119 | A |   | 12/1977 | Odell et al. |        |
|-----------|---|---|---------|--------------|--------|
| 4,392,066 | A |   | 7/1983  | Hirao        |        |
| 5,701,136 | A | * | 12/1997 | Huq et al.   | 345/100|
| 6,845,140 | B2| * | 1/2005  | Moon et al.  | 377/78 |
| 7,038,653 | B2| * | 5/2006  | Moon         | 345/100|
| 2007/0164973 | A1 |   | 7/2007  | Tobita       |        |

FOREIGN PATENT DOCUMENTS

| JP | 55-58619    | 5/1980  |
| JP | 2001-350438 | 12/2001 |
| JP | 2004-246358 | 9/2004  |

OTHER PUBLICATIONS

U.S. Appl. No. 11/614,384, filed Dec. 21, 2006, Tobita.
U.S. Appl. No. 11/670,133, filed Feb. 1, 2007, Tobita et al.
U.S. Appl. No. 11/676,866, filed Feb. 20, 2007, Tobita.
U.S. Appl. No. 11/614,384, filed Dec. 21, 2006, Tobita.
U.S. Appl. No. 11/625,117, filed Jan. 19, 2007, Tobita.
U.S. Appl. No. 11/838,416, filed Aug. 14, 2007, Tobita et al.
U.S. Appl. No. 11/831,131, filed Jul. 31, 2007, Tobita.

* cited by examiner

*Primary Examiner*—Don Le
(74) *Attorney, Agent, or Firm*—Oblon, Spivak, McClelland, Maier & Neustadt, P.C.

(57) ABSTRACT

A shift register includes a first transistor connected between an output terminal and a first clock terminal, a second transistor connected between the output terminal and a first power terminal, and an inverter in which a first node to which the gate of the first transistor is connected serves as an input node and a second node to which the gate of the second transistor is connected serves as an output node. The inverter has third and fourth transistors connected in series between the second node and a first power terminal, both having their gates connected to the first node, a fifth transistor connected between the second node and a third power terminal having its gate connected to the third power terminal, and a sixth transistor connected between a fourth power terminal and a third node serving as a connection node between the third and fourth transistors. The sixth transistor has its gate connected to the second node.

16 Claims, 16 Drawing Sheets

F I G . 7
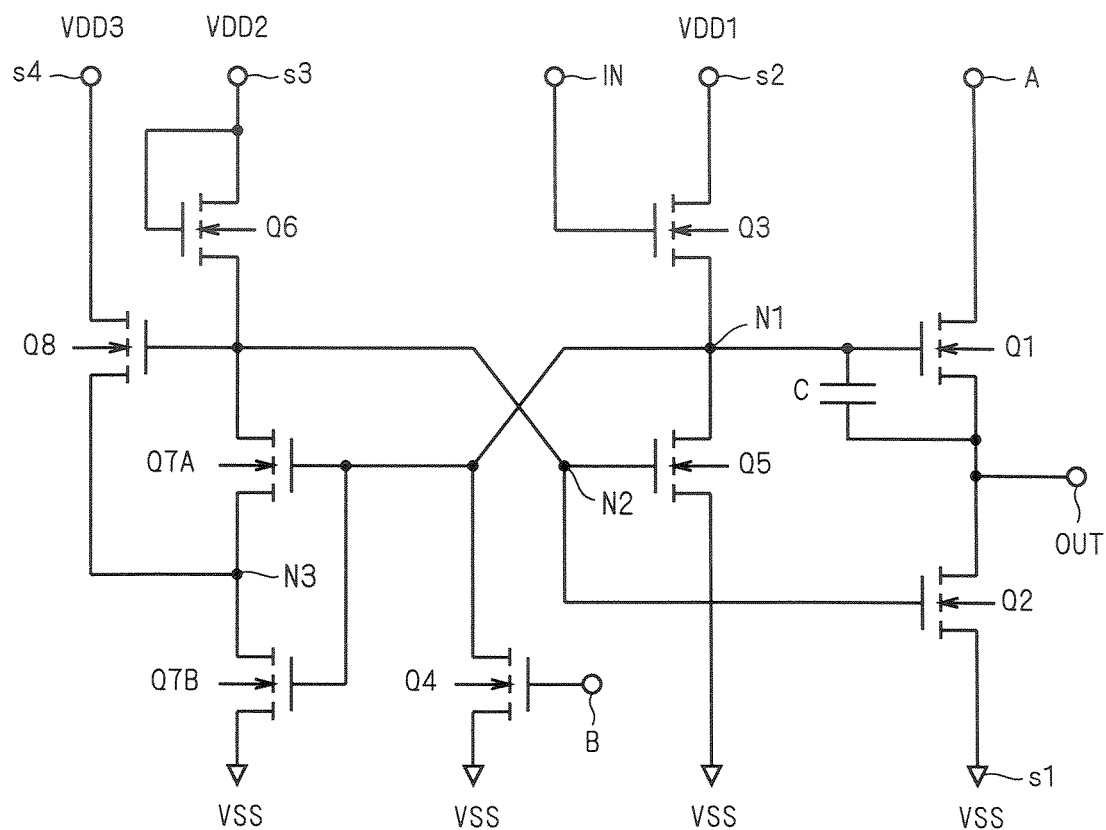

F I G . 9
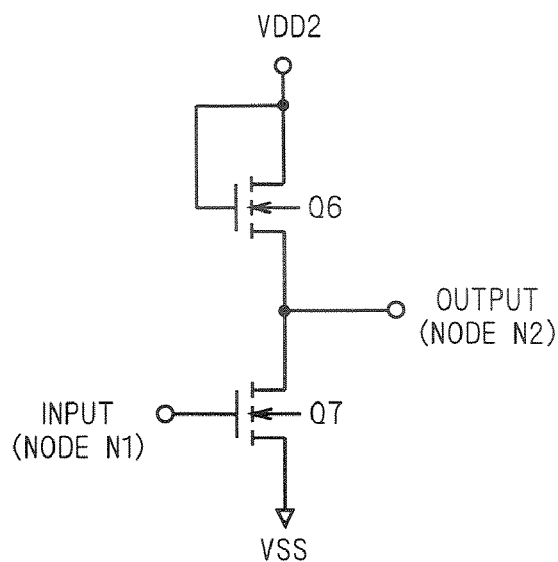
F I G . 1 0
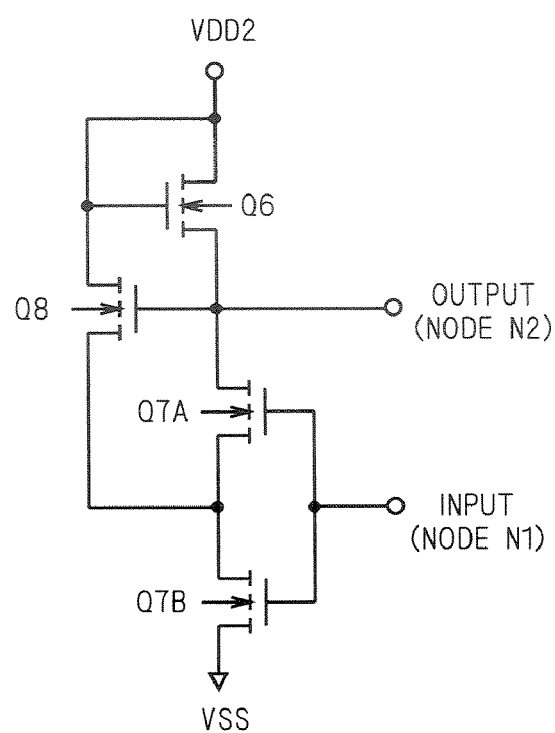

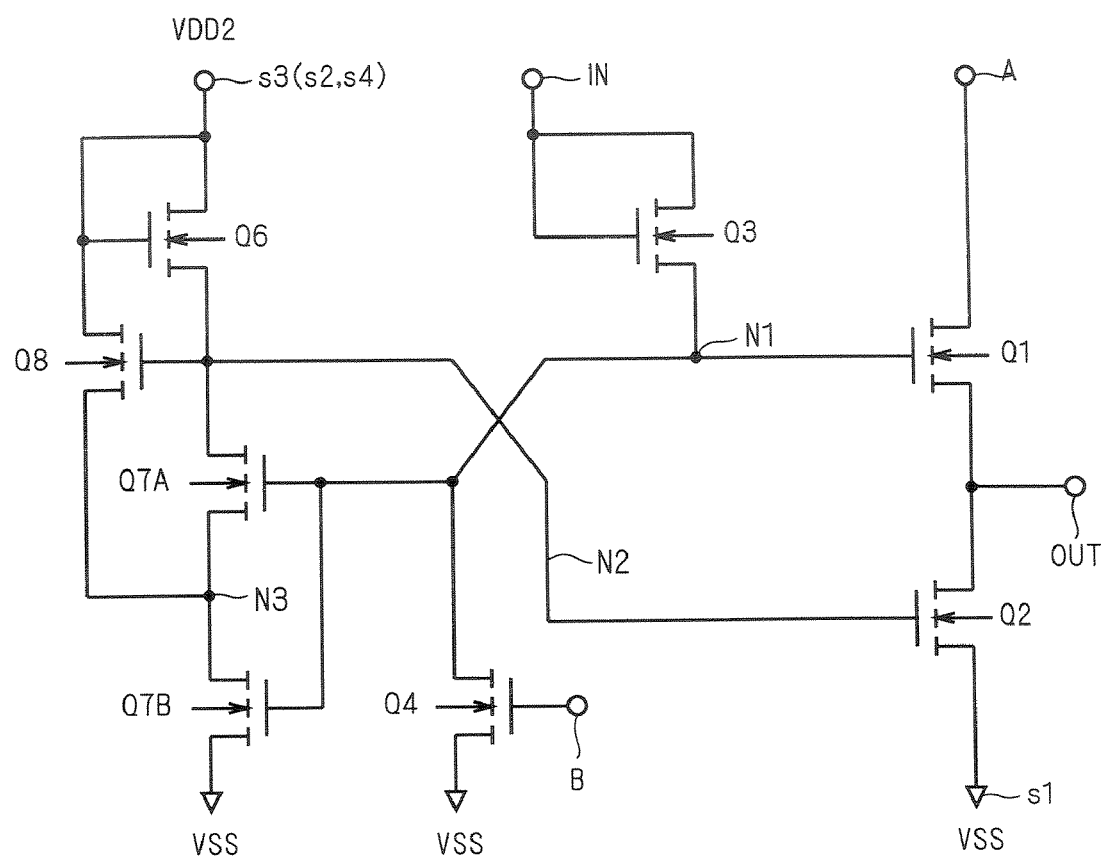
F I G . 1 4

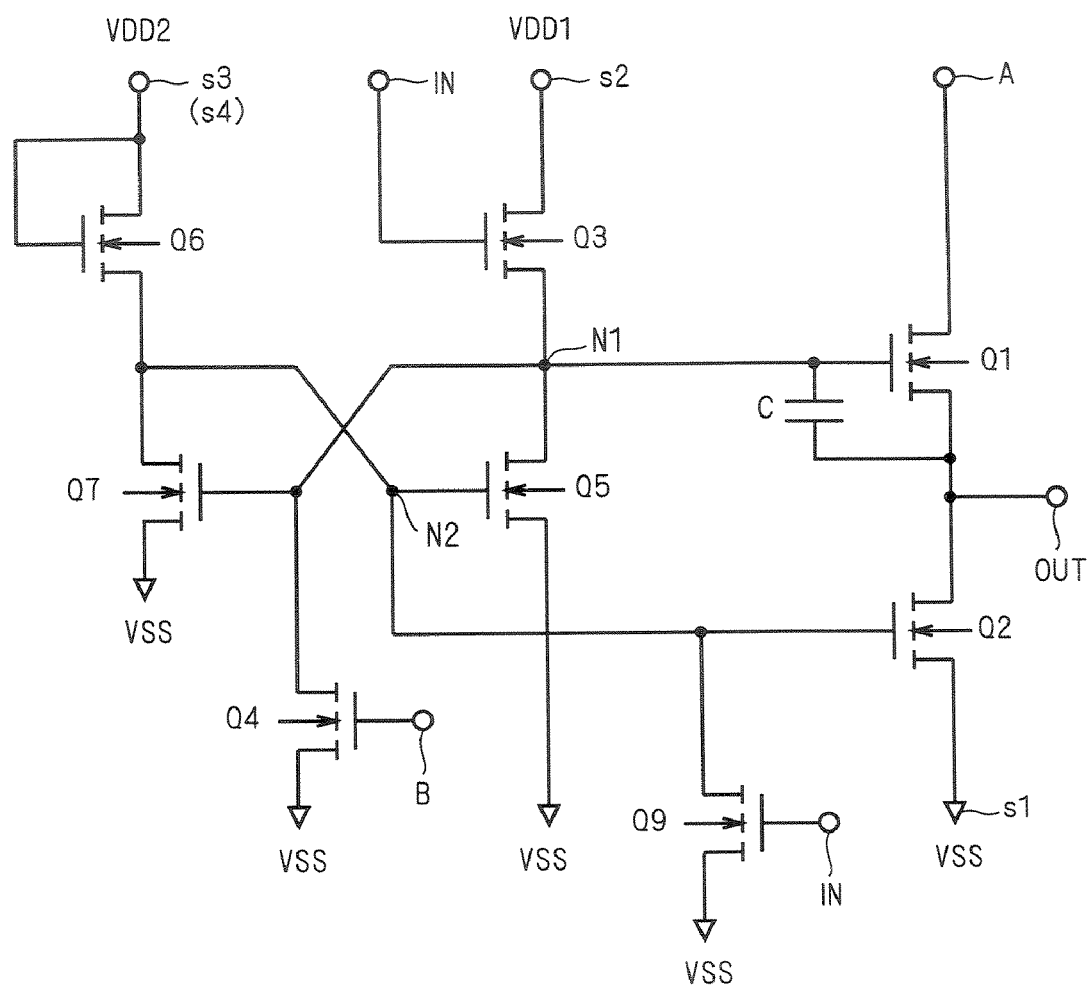
F I G . 1 5

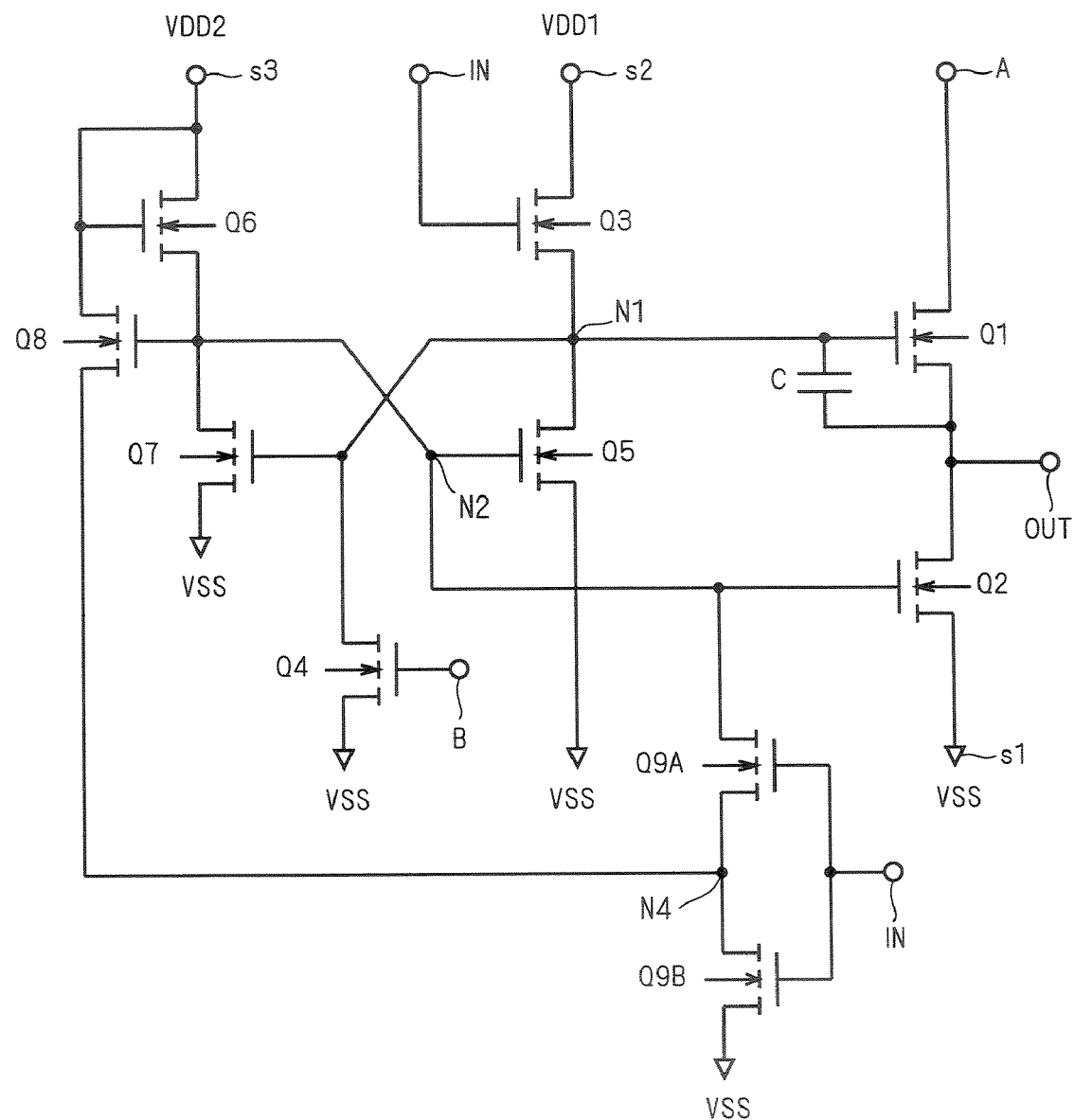
F I G . 1 6

F I G . 1 7
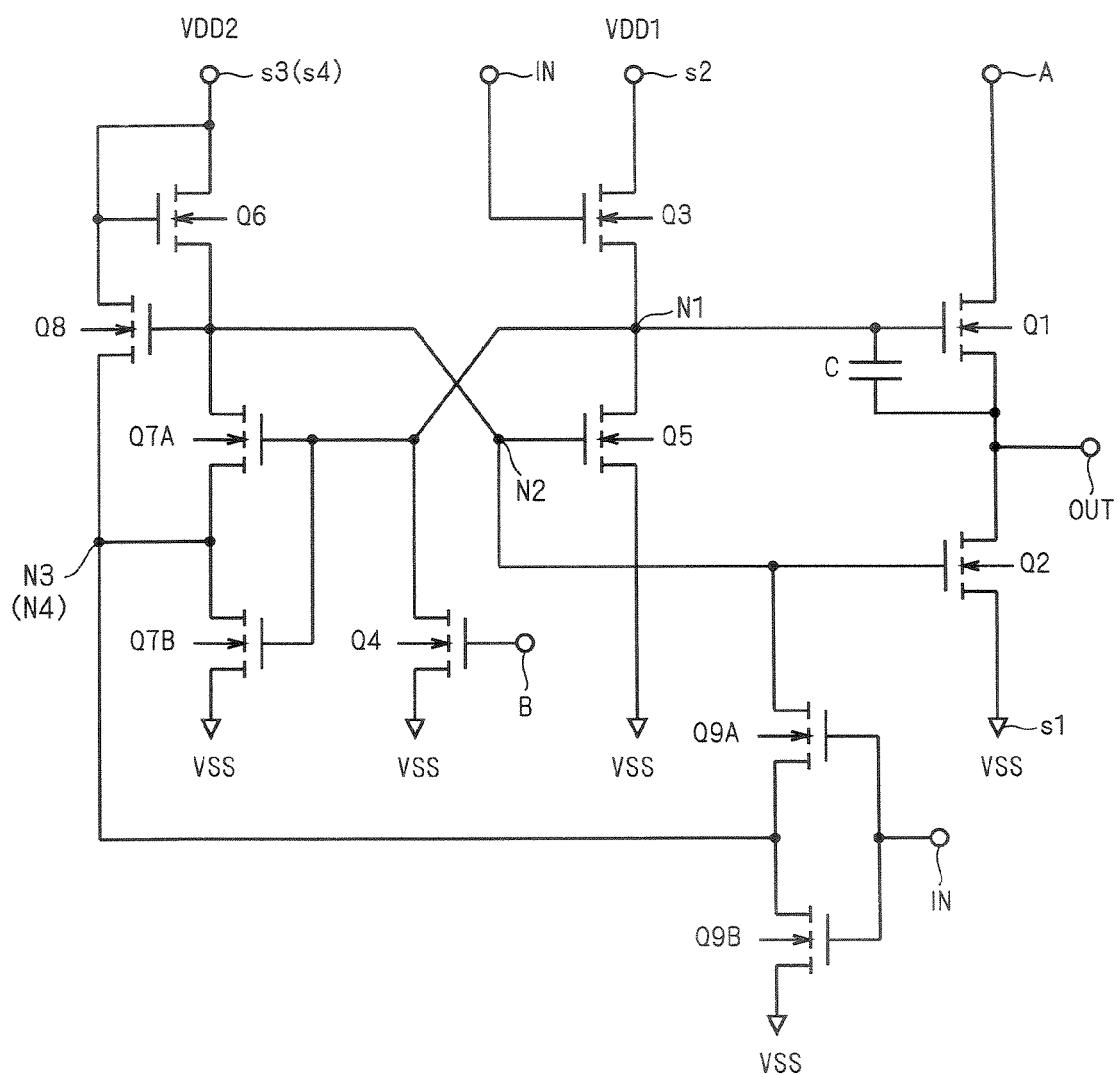

SHIFT REGISTER AND IMAGE DISPLAY APPARATUS CONTAINING THE SAME

BACKGROUND OF THE INVENTION

1. Field of the Invention

The present invention relates to a shift register, and more particularly, to a shift register for use as a scanning-line driving circuit for an image display apparatus or the like, which is formed of field effect transistors of the same conductivity type only.

2. Description of the Background Art

An image display apparatus (hereinafter referred to as a "display apparatus") such as a liquid crystal display includes a display panel in which a plurality of pixels are arrayed in a matrix. A gate line (scanning line) is provided for each row of pixels (pixel line), and gate lines are sequentially selected and driven in a cycle of one horizontal period of a display signal, so that a displayed image is updated. As a gate-line driving circuit (scanning-line driving circuit) for sequentially selecting and driving pixel lines, i.e., gate lines, a shift register for performing a shift operation in one frame period of a display signal can be used.

To reduce the number of steps in the manufacturing process of a display apparatus, such shift register used as the gate-line driving circuit is preferably formed of field effect transistors of the same conductivity type only. Accordingly, various types of shift registers formed of N- or P-type field effect transistors only and display apparatuses containing such shift registers have been proposed (e.g., Japanese Patent Application Laid-Open Nos. 2004-246358 and 2001-350438). As a field effect transistor, a metal oxide semiconductor (MOS) transistor, a thin film transistor (TFT), or the like is used.

A typical shift register shown in, e.g., FIG. 1 of JP2004-246358 includes, in the output stage, a first transistor (pull-up MOS transistor Q1) connected between an output terminal (first gate-voltage signal terminal GOUT in JP2004-246358) and a clock terminal (first power clock CKV) and a second transistor (pull-down MOS transistor Q2) connected between the output terminal and a reference voltage terminal (gate-off voltage terminal VOFF). The shift register also includes an inverter (transistors Q6, Q7) for inverting the potential of the gate of the first transistor and outputting the inverted potential to the gate of the second transistor.

In such shift register, a clock signal input to the clock terminal with the first transistor turned on and the second transistor turned off by a predetermined input signal (an output signal GOUT[N-1] of the previous stage) is transmitted to the output terminal, so that an output signal is output. In contrast, the first transistor is turned off and the second transistor is turned on during a period in which the input signal is not input, so that the clock signal is not transmitted to the output terminal.

A field effect transistor such as TFT has a gate-to-drain overlap capacitance between the gate and drain (hereinafter briefly called "an overlap capacitance"). Accordingly, the gate of the first transistor may rise in potential through a coupling induced by the overlap capacitance on the rising edge of a clock signal input to the drain, even when the first transistor is off. When the gate of the first transistor rises in potential, the gate of the second transistor drops in potential by the action of inverters. This in result reduces the resistance of the first transistor and increases the resistance of the second transistor. This in turn increases the output terminal in potential, which may cause a malfunction of unnecessary activation of a gate line connected thereto.

A display apparatus employing amorphous silicon TFTs (a-Si TFTs) as shift registers of a gate-line driving circuit easily achieves large-area display with great productivity, and is widely used as the screen of a notebook PC, a large-screen display apparatus. etc.

Conversely, an a-Si TFT tends to have its threshold voltage shifted in the forward direction when the gate electrode is continuously forward-biased (dc-biased), resulting in degraded driving capability. Particularly in a shift register of a gate-line driving circuit, the gate of the second transistor is continuously forward-biased for as long as one frame period (about 16 ms), which degrades the second transistor in driving capability, whereby the aforementioned malfunction is likely to occur (which will be described later in detail).

SUMMARY OF THE INVENTION

An object of the present invention is to prevent malfunctions of shift registers and achieve improved driving capability.

The present invention relates to a shift register including a first transistor connected between an output terminal and a clock terminal and a second transistor configured to discharge the output terminal. A node to which a control electrode of the first transistor is connected is defined as a first node, and a node to which a control electrode of the second transistor is connected is defined as a second node.

The shift register according to a first aspect of the invention includes a first pull-down driving circuit in which the first node serves as an input node and the second node serves as an output node. The first pull-down driving circuit has third and fourth transistors connected in series between the second node and a first power terminal, a fifth transistor connected between the second node and a second power terminal, and a sixth transistor controlled to be at a potential at the second node to flow a feedback current to a third node serving as a connection node between the third and fourth transistors.

The first pull-down driving circuit has a threshold voltage higher than the conventional pull-down driving circuit. Thus, the second node is unlikely to drop in potential even when the first node varies in potential in the reset state where the first node is in the L level. This prevents the second node from dropping in potential even when noise resulting from an overlap capacitance of the first transistor occurs at the first node during a period in which the first transistor is off. Therefore, the problem of malfunction caused by the noise at the first node in the reset state can be solved.

The shift register according to a second aspect of the invention includes a second pull-down driving circuit in which an input terminal to which a signal defining timing of charging the first node is input serves as an input node and the second node serves as an output node. The second pull-down driving circuit has seventh and eighth transistors connected in series between the second node and the first power terminal, a ninth transistor connected between the second node and the second power terminal, and a tenth transistor controlled to be at a potential at the second node to flow a feedback current to a fourth node serving as a connection node between the seventh and eighth transistors.

The second pull-down driving circuit has a threshold voltage higher than the conventional pull-down driving circuit, and is unsusceptible to noise applied to the input terminal which is in the L level, which prevents the second node from dropping in potential resulting from the noise applied to the input terminal in the reset state of the unit shift register. Therefore, the problem of malfunction caused by the noise applied to the input terminal can be solved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7 and 8 are circuit diagrams each illustrating the configuration of a unit shift register according to a first preferred embodiment of the present invention;

FIG. 9 is a circuit diagram illustrating the configuration of a pull-down driving circuit of the conventional unit shift register;

FIG. 10 is a circuit diagram illustrating the configuration of a pull-down driving circuit of a unit shift register according to the first preferred embodiment;

FIG. 14 is a circuit diagram illustrating the configuration of a unit shift register according to a fourth preferred embodiment of the invention;

FIG. 15 shows a variant of the conventional unit shift register;

FIG. 16 is a circuit diagram illustrating the configuration of a unit shift register according to a fifth preferred embodiment of the invention; and FIG. 17 is a circuit diagram illustrating the configuration of a unit shift register according to a sixth preferred embodiment of the invention.

DESCRIPTION OF THE PREFERRED EMBODIMENTS

Figure 1:
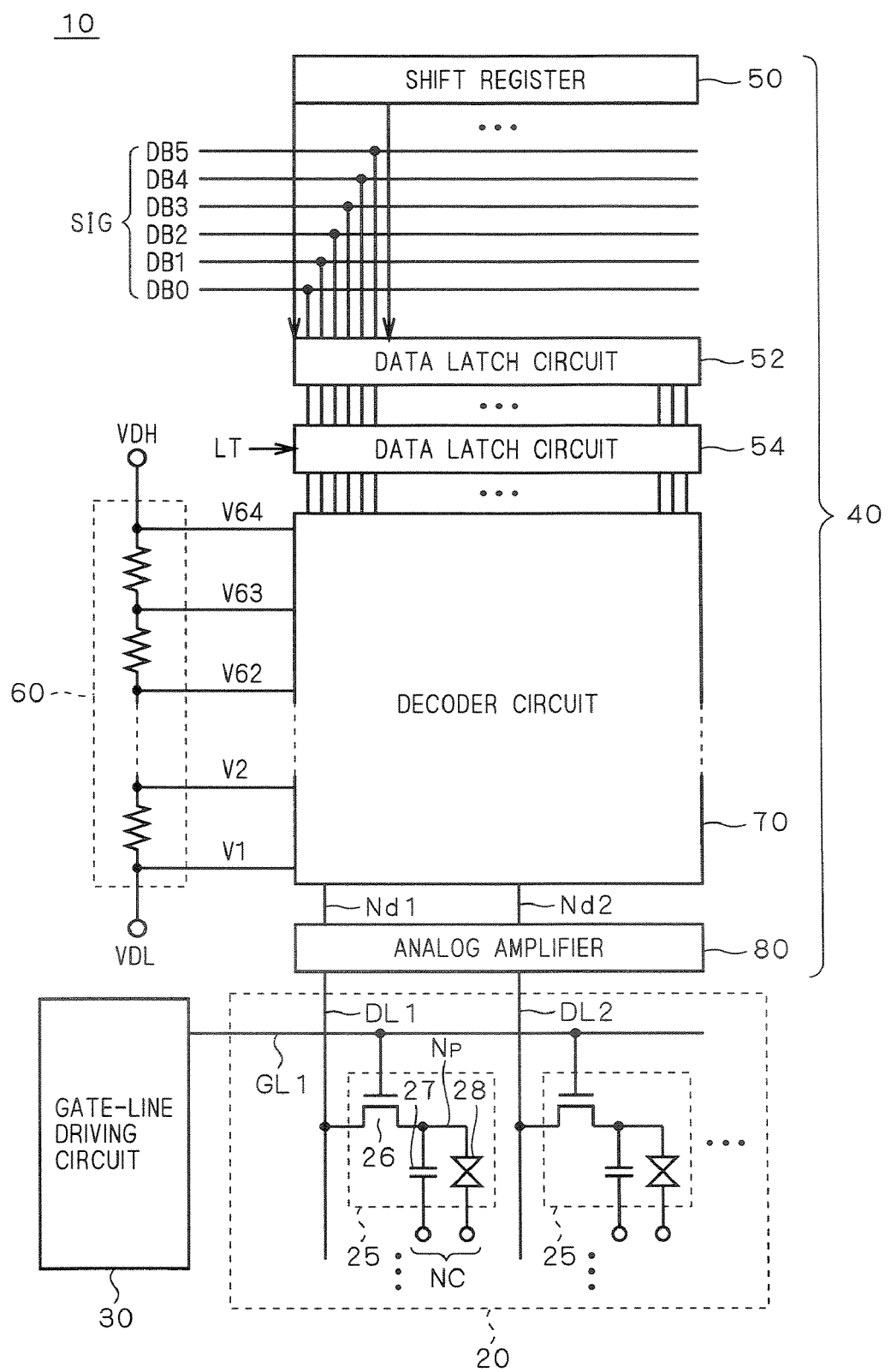
FIG. 1 is a schematic block diagram illustrating the configuration of a display apparatus according to the present invention.

Preferred embodiments of the present invention will be described hereinbelow referring to the accompanied drawings. To avoid repeated and redundant description, elements having the same or corresponding functions are indicated by the same reference characters in the drawings.

First Preferred Embodiment

FIG. 1 is a schematic block diagram illustrating the configuration of a display apparatus according to the present invention. The overall configuration of a liquid crystal display 10 is shown as an representative example of the display apparatus.

The liquid crystal display 10 is provided with a liquid crystal array part 20, a gate-line driving circuit (scanning-line driving circuit) 30 and a source driver 40. As will be described later explicitly, a shift register according to the present embodiment is mounted on the gate-line driving circuit 30.

The liquid crystal array part 20 includes a plurality of pixels 25 arrayed in a matrix. The columns of pixels (hereinafter also referred to as "pixel lines") are respectively provided with gate lines GL1, GL2, . . . (hereinafter also generically referred to as a "gate line GL"), and the rows of pixels (hereinafter also referred to as "pixel rows") are respectively provided with data lines DL1, DL2, . . . (hereinafter generically referred to as a "data line DL"). FIG. 1 representatively shows pixels 25 of the first and second rows in the first column and corresponding gate line GL1 and data lines DL1 and DL2.

Each pixel 25 has a pixel switching device 26 disposed between a corresponding data line DL and a pixel node Np, and a capacitor 27 and a liquid crystal display device 28 connected in parallel between the pixel node Np and a common electrode node NC. The crystal orientation in the liquid crystal display device 28 changes depending on the potential difference between the pixel node Np and common electrode node NC, and in response to this change, the display luminance of the liquid crystal display device 28 changes. Accordingly, the luminance of each pixel 25 can be controlled by a display voltage transmitted to the pixel node Np via the data line DL and pixel switching device 26. In other words, an intermediate potential difference between a potential difference corresponding to the maximum luminance and a potential difference corresponding to the minimum luminance is applied between the pixel node Np and common electrode node NC, whereby halftone luminance can be obtained. Therefore, setting display voltages stepwise, grayscale luminance can be obtained.

The gate-line driving circuit 30 sequentially selects and drives a gate line GL in a predetermined scanning cycle. Each pixel switching device 26 has its gate electrode connected to a corresponding gate line GL. While a certain gate line GL is selected, the pixel switching device 26 is brought into the conducting state in each pixel 25 connected to the selected gate line GL, whereby the pixel node Np is connected to a corresponding data line DL. Then, the display voltage transmitted to the pixel node Np is held by the capacitor 27. Generally, the pixel switching device 26 is constructed from a TFT formed on a substrate of the same insulator as the liquid crystal display device 28 (a glass substrate, a resin substrate or the like).

The source driver 40 is provided to output display voltages set stepwise by a display signal SIG which is an N-bit digital signal, to the data lines DL. As an example, the display signal SIG is assumed to be a 6-bit signal including display signal bits DB0 to DB5. With such 6-bit display signal SIG, $2^6=64$ levels of gray can be displayed in each pixel 25. Further, a display of approximately 260 thousand colors can be achieved by forming one color display unit by three pixels of R (Red), G (Green) and B (Blue).

As shown in FIG. 1, the source driver 40 includes a shift register 50, data latch circuits 52, 54, a gradation voltage generating circuit 60, a decoder circuit 70 and an analog amplifier 80.

In the display signal SIG, the display signal bits DB0 to DB5 corresponding to the display luminance of respective pixels 25 are serially generated. In other words, each of the display signal bits DB0 to DB5 with each timing indicates the display luminance of any one pixel 25 in the liquid crystal array part 20.

The shift register 50 gives an instruction to the data latch circuit 52 to capture the display signal bits DB0 to DB5 in synchronization with a cycle during which the settings of the display signal SIG are changed. The data latch circuit 52 sequentially captures serially-generated display signals SIG to latch display signals SIG for one pixel line.

A latch signal LT input to the data latch circuit 54 is activated with timing when display signals SIG for one pixel line are captured by the data latch circuit 52. In response to this, the data latch circuit 54 captures the display signals SIG for one pixel line latched by the data latch circuit 52 at that time.

The gradation voltage generating circuit 60 is formed of 63 resistor dividers connected in series between a high voltage VDH and a low voltage VDL, for generating 64 levels of gradation voltages V1 to V64, respectively.

The decoder circuit 70 decodes display signals SIG latched by the data latch circuit 54, and based on the result of decoding, selects voltages to be respectively output to decoder output nodes Nd1, Nd2, . . . (generically referred to as a "decoder output node Nd") from among the gradation voltages V1 to V64, and outputs the selected voltages.

As a result, display voltages (selected from among the gradation voltages V1 to V64) corresponding to the display signals SIG for one pixel line latched by the data latch circuit 54 are output to the decoder output node Nd at the same time (in parallel). FIG. 1 representatively shows the decoder output nodes Nd1 and Nd2 corresponding to the data line DL1 of the first row and the data line DL2 of the second row, respectively.

The analog amplifier 80 outputs analog voltages corresponding to display voltages output from the decoder circuit 70 to the decoder output nodes Nd1, Nd2, . . . to the data lines DL1, DL2, . . . , respectively.

The source driver 40 repeatedly outputs display voltages corresponding to a series of display signals SIG for one pixel line to the data line DL in a predetermined scanning cycle, and the gate-line driving circuit 30 sequentially drives the gate lines GL1, GL2, . . . in synchronization with the scanning cycle. Accordingly, image display based on the display signals SIG is provided on the liquid crystal array part 20.

FIG. 1 shows an example of the liquid crystal display 10 with the gate-line driving circuit 30 and source driver 40 formed integrally with the liquid crystal array part 20, however, the gate-line driving circuit 30 and source driver 40 may be provided as an external circuit of the liquid crystal array part 20.

Figure 2:
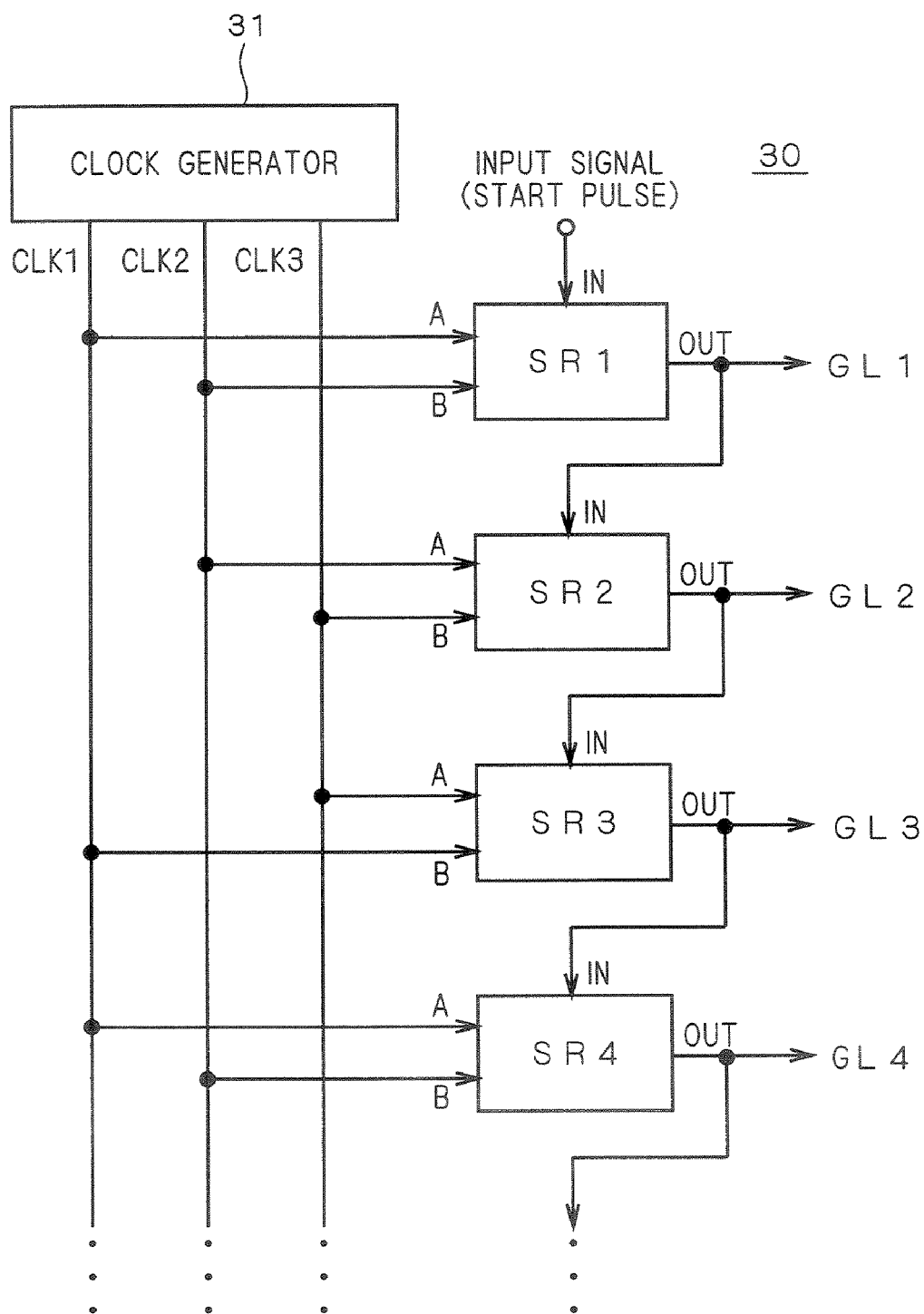
FIG. 2 is a block diagram illustrating an exemplary configuration of a gate-line driving circuit employing unit shift registers according to the invention.

FIG. 2 shows the configuration of the gate-line driving circuit 30. The gate-line driving circuit 30 includes a plurality of shift registers SR1, SR2, SR3, SR4, . . . connected in cascade (for ease of description, each of the cascaded shift registers SR1, SR2, . . . will generically be called a "unit shift register SR"). Each unit shift register SR is provided for one pixel line, i.e., one gate line GL.

A clock generator 31 shown in FIG. 2 is provided to input three phase clock signals CLK1, CLK2 and CLK3, shifted in phase with each other, to the unit shift register SR of the gate-line driving circuit 30. The clock signals CLK1, CLK2 and CLK3 are controlled to be sequentially activated in synchronization with the scanning cycle of the display apparatus.

Each unit shift register SR includes an input terminal IN, an output terminal OUT, and first and second clock terminals A and B. As shown in FIG. 2, two of the clock signals CLK1, CLK2 and CLK3 output from the clock generator 31 are supplied to the clock terminals A and B of each unit shift register SR, respectively. Each unit shift register SR has its output terminal OUT connected to a gate line GL. A start pulse corresponding to the head of each frame period of an image signal is input as an input signal to the input terminal IN of the unit shift register SR1 of the first stage. Input as an input signal to the input terminal IN of each of the unit shift registers SR of the second and following stages is an output signal output from the output terminal OUT of the immediately preceding stage. The output signal of each unit shift register SR is output to the gate line GL as a horizontal (or vertical) scanning pulse.

With the gate-line driving circuit 30 of such configuration, each unit shift register SR outputs an input signal received from the immediately preceding stage (output signal from the immediately preceding stage) to a corresponding gate line GL and to a unit shift register SR of the immediately succeeding stage while shifting the input signal in synchronization with the clock signals CLK1, CLK2 and CLK3 (operation of the unit shift register SR will be described later in detail). As a result, a series of unit shift registers SR serve as a so-called gate-line driving unit for sequentially activating gate lines GL with timing based on the predetermined scanning cycle.

Figure 3:
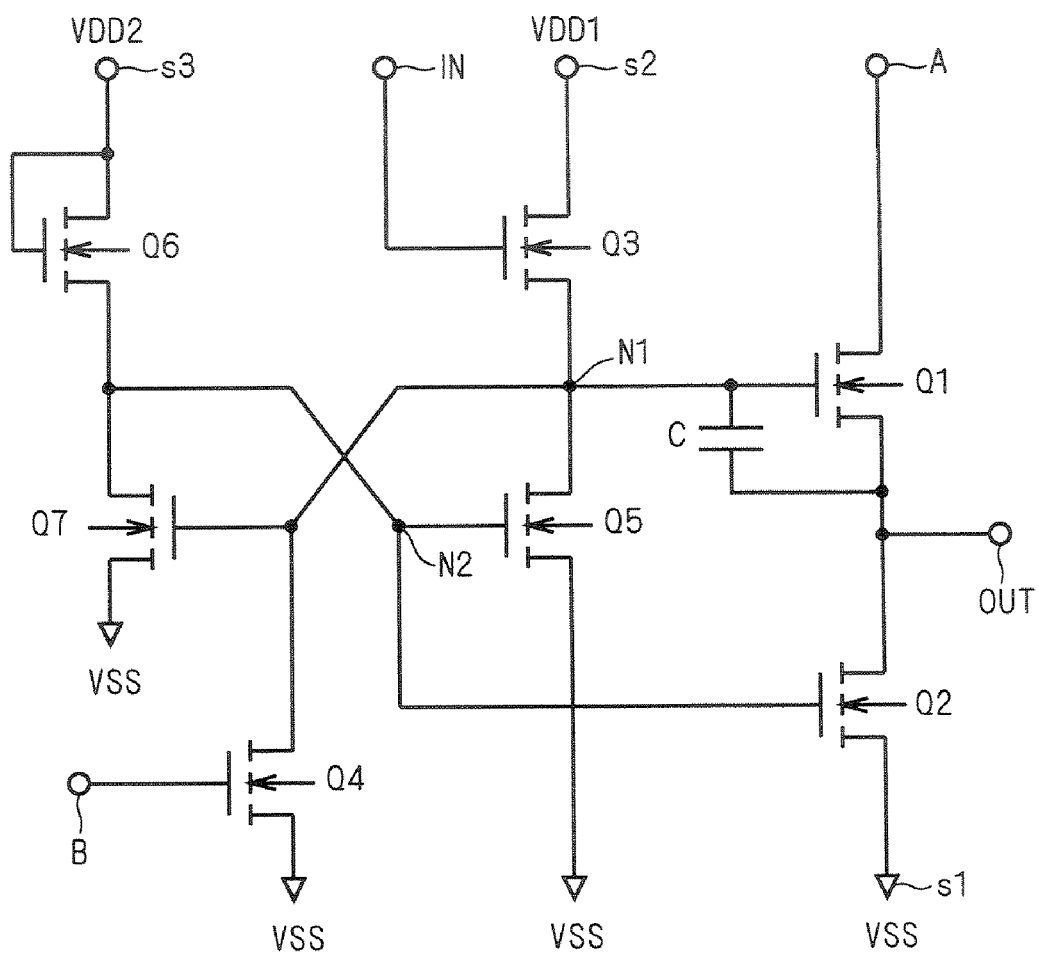
FIG. 3 is a circuit diagram illustrating the configuration of a conventional unit shift register.

For ease of description of the present invention, a conventional unit shift register will now be described. FIG. 3 is a circuit diagram illustrating the configuration of the conventional unit shift register SR. In the gate-line driving circuit 30, the respective unit shift registers SR connected in cascade have substantially the same configuration. Therefore, the configuration of one unit shift register SR will be described below as a representative example. Transistors constituting the unit shift register SR are all field-effect transistors of the same conductivity type, and are all assumed to be N-type TFTs in the present embodiment.

As shown in FIG. 3, the conventional unit shift register SR includes a first power terminal s1 to which a low supply voltage VSS is supplied, and second and third terminals s2 and s3 to which high supply voltages VDD1 and VDD2 are supplied, respectively, in addition to the input terminal IN, output terminal OUT, first clock terminal A and second clock terminal B shown in FIG. 2. The high supply voltages VDD1 and VDD2 may be at the same level. In such case, the second and third power terminals s2 and s3 may be formed of the same terminal. In the following description, the low supply voltage VSS will be a reference potential of the circuit; in practical use, however, a reference potential is determined with reference to a voltage of data written in pixels. For example, the high supply voltages VDD1 and VDD2 may be set at 17V, and the low supply voltage VSS may be set at −12V.

The output stage of the unit shift register SR includes a transistor Q1 (first transistor) connected between the output terminal OUT and first clock terminal A and a transistor Q2 (second transistor) connected between the output terminal OUT and first power terminal s1. Hereinafter, a node to which the gate (control electrode) of the transistor Q1 constituting the output stage of the unit shift register SR is connected will be defined as a node N1 (first node), and a gate node of the transistor Q2 will be defined as a node N2 (second node).

A step-up capacitor C is provided between the gate and source of the transistor Q1 (i.e., between the output terminal OUT and node N1). A transistor Q3 is connected between the node N1 and second power terminal s2, and has its gate connected to the input terminal IN. Transistors Q4 and Q5 are connected between the node N1 and first power terminal s1. The transistor Q4 has its gate connected to the second clock terminal B, and the transistor Q5 has its gate connected to the node N2. A diode-connected transistor Q6 is connected between the node N2 and third power terminal s3, and a transistor Q7 is connected between the node N2 and first power terminal s1, and has its gate connected to the node N1.

The transistor Q7 is defined as having a driving capability (current driving capability) sufficiently higher than that of the transistor Q6. In other words, the transistor Q7 has an on-state resistance lower than that of the transistor Q6. Accordingly, as the gate voltage of the transistor Q7 rises, the node N2 drops in potential; as the gate voltage of the transistor Q7 drops, the node N2 rises in potential. That is, the transistors Q6 and Q7 constitute an inverter whose input node is the first node N1 and output node is the node N2. The inverter is "a ratio inverter" whose operation is defined by the ratio between their on-state resistances. This inverter serves as a "pull-down driving circuit" which drives the transistor Q2 for pulling down the output terminal OUT.

A specific operation of the unit shift register SR shown in FIG. 3 will now be discussed. Since the respective unit shift registers SR constituting the gate-line driving circuit 30 operate substantially in the same manner, the operation of one unit shift register SR will be discussed as a representative example. For ease of description, it is assumed that the first clock terminal A of the unit shift register SR receives the clock signal CLK1 and the second clock terminal B receives the clock signal CLK 3. This case corresponds to, e.g., the unit shift registers SR1 and SR4 shown in FIG. 2. An output signal output from the unit shift register SR at the output terminal OUT is defined as $G_n$, and an output signal from a unit shift register SR of the immediately preceding stage is defined as $G_{n-1}$.

In the initial state, it is assumed that the node N1 is at the L (low) level (VSS), and the node N2 is at the H level (VDD2-Vth (Vth: threshold voltage of transistor)). Hereinafter, this state will be called a "reset state". It is also assumed that the first clock terminal A (clock signal CLK1), second clock terminal B (clock signal CLK3) and input terminal IN (output signal $G_{n-1}$ from the immediately preceding stage) are all at the L level. In the reset state, the transistor Q1 is off (cut-off state) and the transistor Q2 is on (conducting state). Accordingly, the output terminal OUT (output signal $G_n$) is kept at the L level regardless of the level at the first clock terminal A (clock signal CLK1). That is, the gate line connected to this unit shift register SR is in the non-selected state.

Starting from that state, the output signal $G_{n-1}$ from the immediately preceding stage, when raised to the H level, is input to the input terminal IN of the unit shift register SR of concern to turn on the transistor Q3. At this time, the node N2 is at the H level, and thus, the transistor Q5 is also on, however, the node N1 rises in potential since the transistor Q3 is defined as having a driving capability sufficiently higher than that of the transistor Q5 and having an on-state resistance sufficiently lower than that of the transistor Q5.

The transistor Q7 thereby starts conducting, causing the node N2 to drop in potential. Then, the transistor Q5 increases in resistance, causing the node N1 to rapidly rise in potential to sufficiently turn on the transistor Q7. As a result, the node N2 drops to the L level (VSS), the transistor Q5 turns off, and the node N1 rises to the H level (VDD1-Vth). In such state where the node N1 is at the H level and the node N2 is at the L level (hereinafter this state will be called a "set state"), the transistor Q1 is on, and the transistor Q2 is off. Since the node N1 is brought into a floating state even when the output signal $G_{n-1}$ from the immediately preceding stage returns to the L level to turn off the transistor Q3, this set state is further maintained.

In the set state, the transistor Q1 is on and the transistor Q2 is off. Thus, when the clock signal CLK1 input to the first clock terminal A rises to the H level, the output terminal OUT rises in potential. At this time, the node N1 is stepped up by a certain voltage (hereinafter referred to as a "step-up amount ΔV") through a coupling induced between the step-up capacitor C and gate-channel capacitance (gate capacitance) of the transistor Q1. Accordingly, the gate-source voltage of the transistor Q1 is maintained higher than the threshold voltage (Vth) even when the output terminal OUT rises in potential, so that the transistor Q1 maintains a low impedance. Therefore, the output signal $G_n$ varies in level along with the potential at the first clock terminal A. Particularly when the gate-source voltage of the transistor Q1 is sufficiently high, the transistor Q1 operates in the non-saturated condition, causing no loss by the threshold voltage, which brings the output terminal OUT into the same potential as the clock signal CLK1. Accordingly, while the clock signal CLK1 input to the first clock terminal A is at the H level, the output signal $G_n$ is also at the H level to bring the gate line into a selected state. Thereafter, when the clock signal CLK1 returns to the L level, the output signal $G_n$ also returns to the L level to bring the gate line into a non-selected state.

Thereafter, when the clock signal CLK3 input to the second clock terminal B rises to the H level, the transistor Q4 is turned on to cause the node N1 to drop to the L level. The transistor Q7 accordingly turns off to cause the node N2 to rise to the H level. That is, the unit shift register SR returns to the reset state in which the transistor Q1 is off and the transistor Q2 is on.

Giving a summary of the above-described operation, the unit shift register SR is in the reset state unless a signal (start pulse or output signal $G_{n-1}$ from the immediately preceding stage) is input to the input terminal IN, and the node N2 is maintained at the H level (VDD2-Vth) during that period, so that the output terminal OUT (gate line) is maintained at the L level (VSS) with low impedance. When a signal is input to the input terminal IN, with that timing, the node N2 drops to the L level (VSS) while the node N1 is charged to the H level (VDD1-Vth), so that the set state is brought about. That is, in the unit shift register SR, a signal input to the input terminal IN defines timing when the set state is brought about.

In the set state, the node N1 rises in potential by the step-up amount ΔV when the signal input to the first clock terminal A (clock signal CLK1) rises to the H level. While the first clock terminal A is at the H level, the output terminal OUT rises to the H level to activate the gate line (therefore, the node N1 may also be called a "step-up node"). Thereafter, when a signal (clock signal CLK3) is input to the second clock terminal B, the node N1 returns to the L level (VSS) and the node N2 returns to the H level (VDD2-Vth), so that the original reset state is brought about (therefore, the node N2 may also be called a "reset node"). That is, in the unit shift register SR, a signal input to the second clock terminal B defines timing when the set state is brought about.

A plurality of unit shift registers SR each operating as described above are connected in cascade as shown in FIG.

Figure 4:
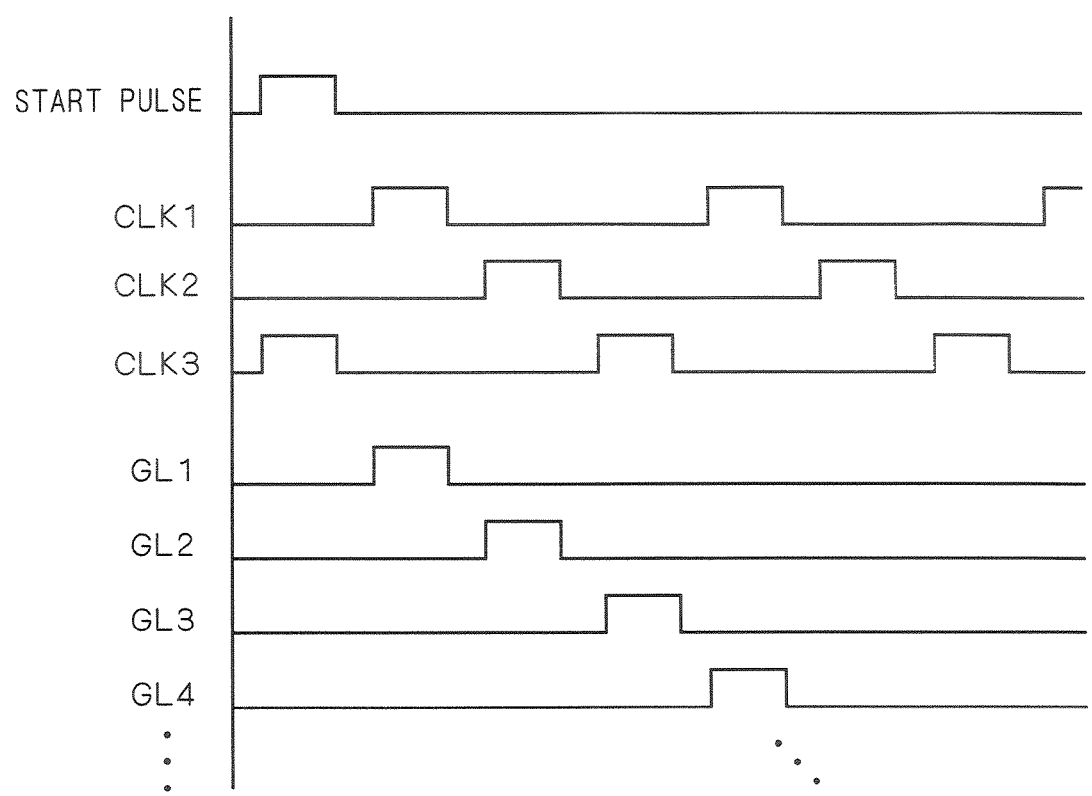
FIG. 4 is a timing chart of an operation of the gate-line driving circuit shown in FIG. 2.

2 to constitute the gate-line driving circuit 30. Then, the input signal (start pulse) input to the input terminal IN of the unit shift register SR of the first stage is transmitted to unit shift registers SR2, SR3, . . . in sequence while being shifted with timing synchronized with the clock signals CLK1, CLK2 and CLK3 as shown in the timing chart of FIG. 4. The gate-line driving circuit 30 can thereby drive the gate lines GL1, GL2, GL3, . . . in sequence in a predetermined scanning cycle.

Figure 5:
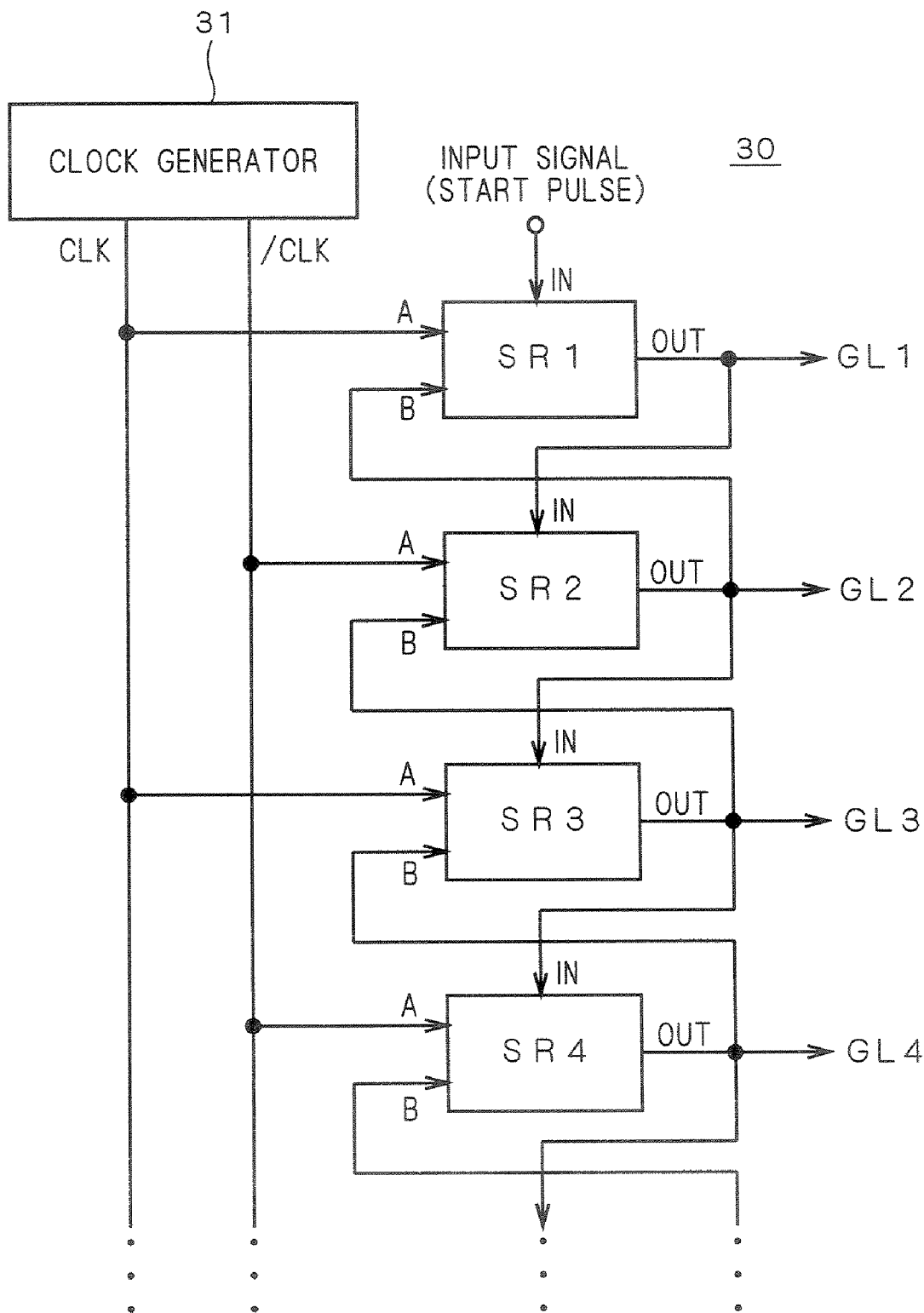
FIG. 5 is a block diagram illustrating another exemplary configuration of a gate-line driving circuit employing unit shift registers according to the invention.

While the above example shows the case in which the plurality of unit shift registers SR operate on the basis of three phase clock signals, two phase clock signals may be used for operation. FIG. 5 illustrates the configuration of the gate-line driving circuit 30 in that case.

In that case, the gate-line driving circuit 30 also includes a plurality of unit shift registers SR connected in cascade. Specifically, each of the unit shift registers SR has its input terminal IN connected to the output terminal OUT of a unit shift register SR of the immediately preceding stage, except that the input terminal IN of the unit shift register SR of the first stage receives a start pulse as an input signal.

The clock generator 31 in this case outputs two phase clock signals CLK and /CLK of opposite phases to each other. Either of the clock signals CLK and /CLK is alternately input to the first clock terminal A of each of the unit shift registers SR such that each adjacent unit shift registers SR receive clock signals of opposite phases to each other, respectively. As shown in FIG. 5, each of the unit shift registers SR has the second clock terminal B connected to the output terminal OUT of a unit shift register SR of a succeeding stage (in this example, the immediately succeeding stage).

The operation of a unit shift register SR in the gate-line driving circuit 30 configured as shown in FIG. 5 will be described. The operation of one unit shift register SR will also be discussed as a representative example. For ease of description, it is assumed that the first clock terminal A of the unit shift register SR receives the clock signal CLK1. This case corresponds to, e.g., the unit shift registers SR1 and SR3 shown in FIG. 5. An output signal from the unit shift register SR of concern is defined as $G_n$, and output signals from unit shift registers SR of the immediately preceding and succeeding stages are defined as $G_{n-1}$ and $G_{n+1}$, respectively.

In the initial state, the reset state is assumed in which the node N1 is at the L level (VSS) and the node N2 is at the H level (VDD2-Vth). It is also assumed that the first clock terminal A (clock signal CLK), second clock terminal B (output signal $G_{n+1}$ from the immediately succeeding stage) and input terminal IN (output signal $G_{n-1}$ from the immediately preceding stage) are all at the L level.

Starting from that state, the output signal $G_{n-1}$ from the immediately preceding stage, when raised to the H level, is input to the input terminal IN of the unit shift register SR of concern to turn on the transistor Q3, causing the node N1 to rise in potential. The transistor Q7 thereby starts conducting, causing the node N2 to drop in potential. Then, the transistor Q5 increases in resistance, causing the node N1 to rapidly rise in potential, so that the transistor Q7 sufficiently turns on. As a result, the node N2 drops to the L level (VSS) to turn off the transistor Q5, causing the node N1 to rise to the H level (VDD1-Vth). As a result, the set state is brought about in which the transistor Q1 is on and the transistor Q2 is off.

Then, when the clock signal CLK rises to the H level to cause the output terminal OUT to rise in potential, the node N1 rises in potential by a certain voltage (step-up amount $\Delta V$) through the coupling induced between the step-up capacitor C and gate-channel capacitance of the transistor Q1. Therefore, the output signal $G_n$ varies in level along with the level at the first clock terminal A. While the clock signal CLK is at the H level, the output signal $G_n$ is also at the H level. Thereafter, when the clock signal CLK returns to the L level, the output signal $G_n$ also returns to the L level.

After the output signal $G_n$ is transmitted to a unit shift register SR of the immediately succeeding stage, and when the output signal $G_{n+1}$ from the immediately succeeding stage rises to the H level, the signal $G_{n+1}$ is input to the second clock terminal B to turn on the transistor Q4, causing the node N1 to drop to the L level. The transistor Q7 accordingly turns off, causing the node N2 to rise to the H level. That is, the unit shift register SR of concern returns to the reset state in which the transistor Q1 is off and the transistor Q2 is on.

As described, in the case of the gate-line driving circuit 30 configured as shown in FIG. 5, the operation of each of the unit shift registers SR is substantially the same as in the case of FIG. 2 except that the second clock terminal B receives the output signal $G_{n+1}$ from the immediately succeeding stage.

The above-described operation is carried out in sequence by the plurality of unit shift registers SR1, SR2, . . . connected in cascade as shown in FIG. 5. Accordingly, the input signal (start pulse) input to the input terminal IN of the unit shift register SR1 of the first stage is transmitted to the unit shift registers SR2, SR3, . . . in sequence while being shifted with timing synchronized with the clock signals CLK and /CLK. As a result, the gate-line driving circuit 30 can thereby drive the gate lines GL1, GL2, GL3, . . . in sequence in synchronization with the clock signals CLK and /CLK as shown in the timing chart of FIG. 6.

Figure 6:
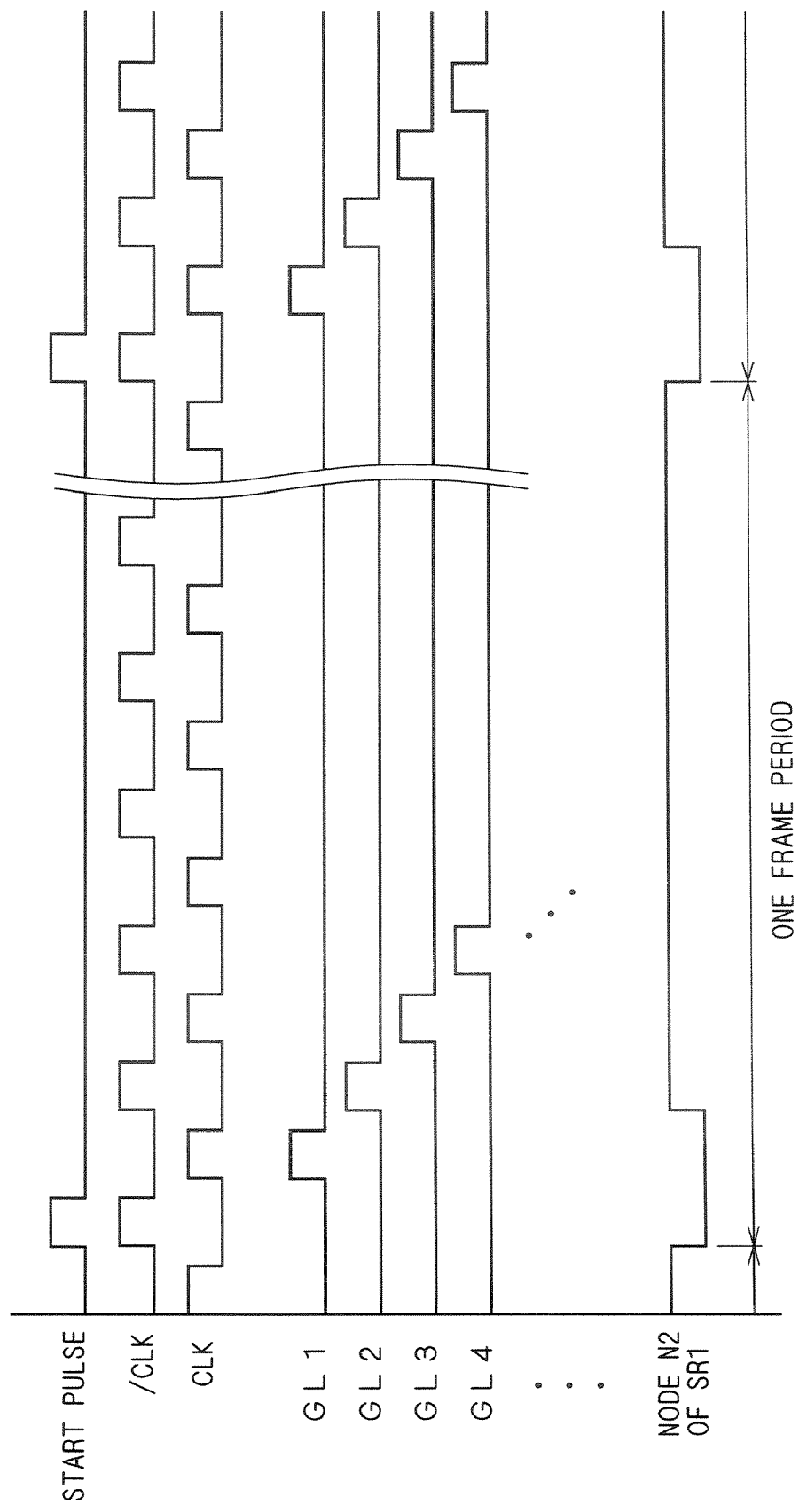
FIG. 6 is a timing chart of an operation of the gate-line driving circuit shown in FIG. 5.

In the configuration shown in FIG. 5, however, the second clock terminal B receives the output signal $G_{n+1}$ from the immediately succeeding stage. Accordingly, each of the unit shift registers SR returns to the reset state (i.e., the above-described initial state) only after a unit shift register SR of the immediately succeeding stage is operated at least once. Each of the unit shift registers SR cannot carry out the normal operation as shown in FIG. 6 unless it undergoes the reset state. Therefore, the configuration shown in FIG. 5 requires carrying out a dummy operation in which a dummy input signal is transmitted through the unit shift registers SR from the first to the last stages prior to the normal operation. Alternatively, a reset transistor may additionally be provided between the node N2 and third power terminal s3 (high supply voltage) of each of the unit shift registers SR to carry out a reset operation of compulsory charging the node N2 prior to the normal operation. In that case, however, the provision of a reset signal line is additionally required.

The aforementioned problem of malfunction of the conventional unit shift register SR will now be described in detail. In the following description, each transistor constituting a unit shift register SR is assumed to be an a-Si TFT.

The lowermost part of the timing chart of FIG. 6 shows voltage waveforms at the node N2 of the unit shift register SR1 in the gate-line driving circuit 30 shown in FIG. 5. As described above, when a signal input to the input terminal IN (start pulse or output signal $G_{n-1}$ from the immediately preceding stage) rises to the H level, the node N2 drops to the L level, but immediately returns to the H level by a signal input to the second clock terminal B (output signal $G_{n+1}$ from the immediately succeeding stage) to be maintained at the H level for about one frame period (about 16 ms) (although not shown, this behavior is also seen in the case of FIG. 2). That is, the gate of each of the transistors Q2 and Q5 is continuously forward-biased (dc-biased) for about one frame period in each unit shift register SR. Accordingly, when each unit shift register SR is formed of a-Si TFTs, the threshold voltages of the transistors Q2 and Q5 are shifted to the positive direction, resulting in degraded driving capability.

A unit shift register SR is now assumed to be in the non-selected state of the gate line and in the reset state (node N1 at L level, node N2 at H level). In this state, the transistor Q1 is off, but the clock signal CLK is repeatedly input to the first clock terminal A to which the drain of the transistor Q1 is connected.

At this time, the node N1 varies in potential along with the input of the clock signal CLK through a coupling induced by the gate-to-drain overlap capacitance of the transistor Q1. More specifically, the behavior in which the node N1 is charged on the rising edge of the clock signal CLK and discharged through the transistor Q5 is repeated. Hence, noise of sawtooth repeated waveforms occurs at the node N1. When the transistor Q7 is turned on due to such noise, the node N2 drops in potential.

As described, the transistors Q2 and Q5 of the unit shift register SR are each dc forward-biased between the gate and source, and therefore are degraded in driving capability with time. When the node N2 drops in potential in such state, the transistor Q5 cannot quickly discharge charges resulting from the noise at the node N1, causing the node N1 to rise further in potential. Since the transistor Q1 is accordingly reduced in resistance, charges are supplied to the output terminal OUT when the clock signal CLK rises to the H level. The transistor Q2 is also degraded in driving capability at this time, and therefore cannot quickly discharge charges at the output terminal OUT, causing the output terminal OUT to rise in potential. That is, a malfunction that the gate line which should be in the non-selected state is brought into the selected state occurs, resulting in a display malfunction of the liquid crystal display 10. A unit shift register SR according to the present invention capable of solving such problem will be described below.

FIG. 7 is a circuit diagram illustrating the configuration of the unit shift register SR according to the first preferred embodiment. As shown in the drawing, the output stage of the unit shift register SR includes the transistor Q1 (first transistor) connected between the output terminal OUT and first clock terminal A and the transistor Q2 (second transistor) connected between the output terminal OUT and first power terminal s1. The step-up capacitor C is provided between the gate (control electrode) and source of the transistor Q1, i.e., between the node N1 and output terminal OUT. The transistor Q3 is connected between the node N1 and second power terminal s2, and has its gate connected to the input terminal IN. Transistors Q4 and Q5 are connected between the node N1 and first power terminal s1. The transistor Q4 has its gate connected to the second clock terminal B, and the transistor Q5 has its gate connected to the node N2. This configuration is the same as the conventional unit shift register SR shown in FIG. 3.

The unit shift register SR according to the present embodiment also includes an inverter (first pull-down driving circuit) in which the node N1 serves as an input node and the node N2 serves as an output node. In the present embodiment, the transistors Q6, Q7A, Q7B and Q8 constitute the inverter. As shown in FIG. 7, the transistor Q6 is diode-connected and is connected between the node N2 and third power terminal s3. The transistors Q7A and Q7B are connected in series between the node N2 and first power terminal s1, and have their gates connected to the node N1. Defining a connection node between the transistors Q7A and Q7B as a node N3, the transistor Q8 is connected between the node N3 and a fourth power terminal s4 to which a high supply voltage VDD3 is supplied, and has its gate connected to the node N2. The transistor Q8 is controlled to be at the potential at the node N2 to flow a feedback current from the fourth power terminal s4 to the node N3. The inverter having such configuration may also be called "Schmitt trigger circuit" (cf. Japanese Patent Application Laid-Open No. 56-96525 (1981), for example).

Figure 8:
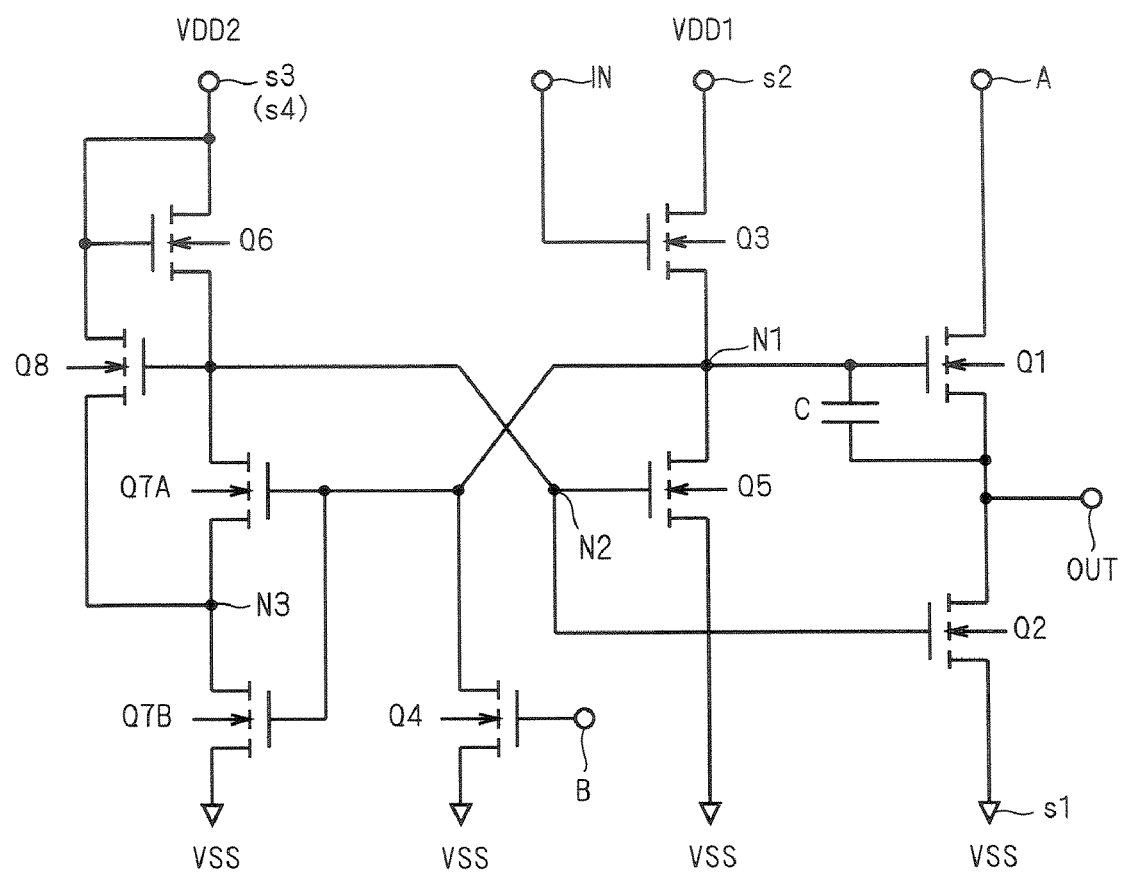

The high supply voltage VDD3 is capable of charging the node N3 to a predetermined potential when the node N2 rises to the H level to turn on the transistor Q8, which may be at the same level as the high supply voltages VDD1 and VDD2. For instance, when the high supply voltage VDD3 is at the same level as the high supply voltage VDD2, the third and fourth power terminals s3 and s4 may be connected to each other as shown in FIG. 8, so that the both terminals are formed of the same terminal. (In other words, the third power terminal s3 also serves as the fourth power terminal s4.) Such configuration reduces the area occupied by a wire for power supply. For ease of description, the following description will be made on the basis of the circuit configuration shown in FIG. 8.

As is apparent from comparison between the circuit diagrams of FIGS. 3 and 8, the pull-down driving circuit included in the conventional unit shift register SR is an inverter shown in FIG. 9, and the pull-down driving circuit according to the present embodiment is an inverter shown in FIG. 10. The unit shift register SR according to the present embodiment is similar in logical operation to the conventional unit shift register described earlier referring to FIG. 4 or 6 except the circuit configuration of the inverter. Therefore, the description of the operation of the unit shift register SR according to the present embodiment will be omitted.

Figure 11:
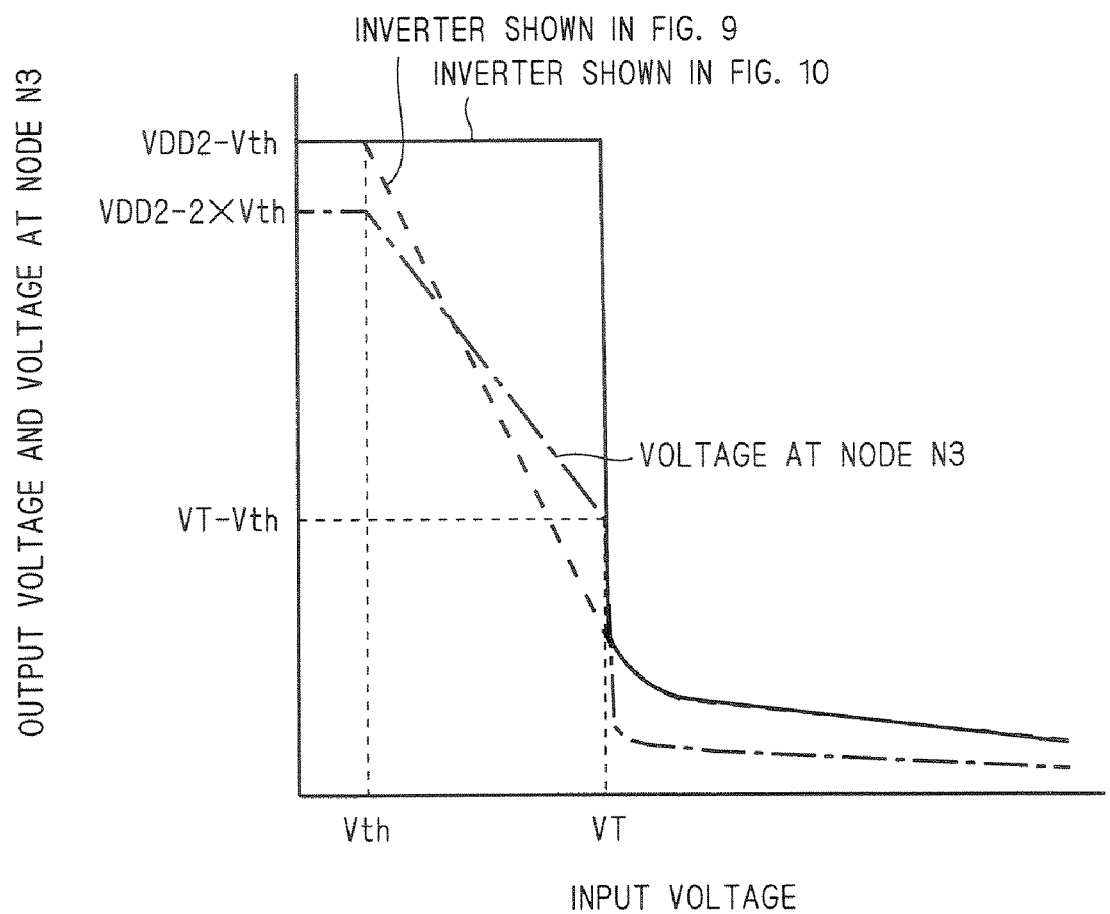
FIG. 11 is a graph showing voltage characteristics of inverters shown in FIGS. 9 and 10, respectively.

FIG. 11 is a graph showing voltage characteristics of inverters shown in FIGS. 9 and 10, respectively. As shown in FIG. 11, in the inverter shown in FIG. 9, the transistor Q7 starts conducting when the input voltage exceeds the threshold voltage Vth of the transistor Q7, causing the output voltage to start dropping. In the inverter shown in FIG. 10, the voltage at which the output level starts dropping (threshold voltage of the inverter: VT) is higher than in the conventional inverter.

In the inverter shown in FIG. 10, the transistor Q8 is turned on when the input voltage is in the L level and the output voltage is in the H level, so that the source of the transistor Q7 (node N3) is forward-biased. The transistor Q7A does not conduct until the gate becomes higher than the source in potential by the threshold voltage Vth or more. Therefore, to inverse the inverter shown in FIG. 10, the input voltage (at node N1) needs to be higher than the biased node N3 in potential by the threshold voltage Vth or more. This is because the threshold voltage of the inverter shown in FIG. 10 is higher than that of the inverter shown in FIG. 9.

The principle of the inverter shown in FIG. 10 will now be described. Letting the input voltage be in the L level, the transistors Q7A and Q7B are off, which means the output voltage is in the H level (VDD2-Vth). The transistor Q8 is thus in the on state, and the node N3 is biased to a level of VDD-2×Vth.

When the input voltage starts rising to exceed the threshold voltage Vth of the transistor Q7B, then the transistor Q7A starts conducting to cause the node N3 to drop in potential, however, the input voltage is maintained at the H level since the transistor Q7A does not conduct until the input voltage becomes higher than the node N3 in potential by the threshold voltage Vth or more. When the input voltage rises further to become higher than the node N3 in potential by the threshold voltage Vth or more, the transistor Q7A starts conducting.

Then, a positive feedback loop of: increase in driving capability of transistor Q7A—drop in output voltage—degradation in driving capability of transistor Q8—drop in potential at node N3—increase in driving capability of transistor Q7A—is formed in the inverter. Then, the inverter abruptly inverses as shown in the graph of FIG. 11.

In the case where the input voltage drops from the H level, when the input voltage drops to the threshold voltage VT of the inverter, an opposite loop to the above loop of: degradation in driving capability of transistor Q7A—rise in output voltage—increase in driving capability of transistor Q8—rise in potential at node N3—degradation in driving capability of transistor Q7A—is formed. In this case, the inverter also inverses abruptly.

As described above, the inverter shown in FIG. 10 has a threshold voltage higher than the inverter shown in FIG. 9. Accordingly, in the unit shift register SR according to the present embodiment employing the inverter shown in FIG. 10 as a pull-down driving circuit, the node N2 is unlikely to drop in potential even when the node N1 varies in potential to some extent in the reset state where the node N1 is in the L level. This prevents the node N2 from dropping in potential even when noise resulting from overlap capacitance occurs at the node N1 during a period in which the transistor Q1 is off. Therefore, the problem of malfunction caused by the noise at the node N1 in the reset state can be solved. This in result prevents a display malfunction of the display apparatus including the gate-line driving circuit formed of the unit shift registers SR according to the present embodiment.

Particularly, when the unit shift register SR is formed of a-Si TFTs, the transistors Q2 and Q5 with their gates connected to the node N2 are degraded in driving capability, causing the aforementioned problem to be likely to occur, so that the application of the present application is advantageous.

Second Preferred Embodiment

Figure 12:
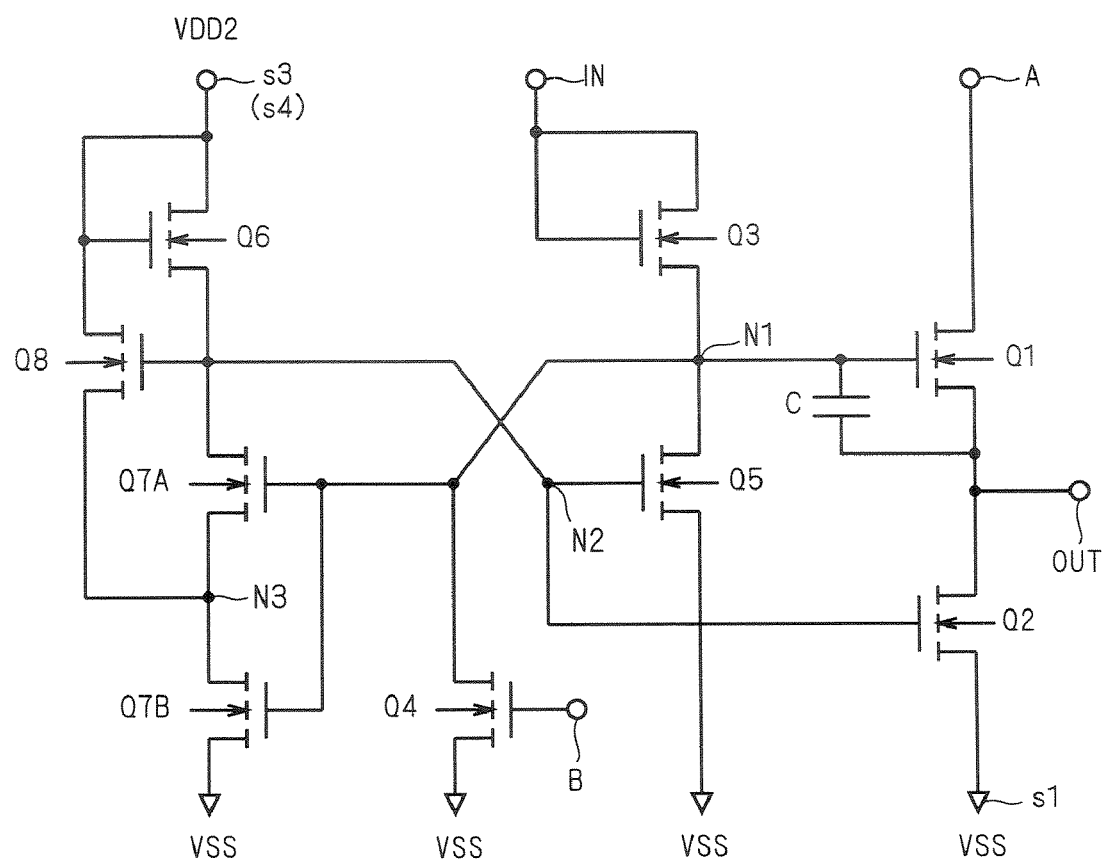
FIG. 12 is a circuit diagram illustrating the configuration of a unit shift register according to a second preferred embodiment of the invention.

FIG. 12 is a circuit diagram illustrating the configuration of a unit shift register SR according to a second preferred embodiment of the present invention. According to the present embodiment, the transistor Q3 has its drain connected to the input terminal IN, not to the power source. This can reduce the area occupied by a wire for power supply. However, it should be noted that the input terminal IN is connected to the output terminal OUT of the immediately preceding stage, which increases a load on the output stage of each unit shift register SR, so that the speed of circuit operation may be degraded.

Third Preferred Embodiment

A field effect transistor including TFT is a device which conducts by electric connection between the drain and source made by a conductive channel formed directly under a gate electrode with a gate insulation film interposed therebetween when a voltage not less than a threshold voltage is applied to the gate. Accordingly, a field effect transistor in the conducting state may also function as a capacitive element (gate capacitance) with its gate and channel serving as both electrodes and the gate insulation film serving as a dielectric layer.

Figure 13:
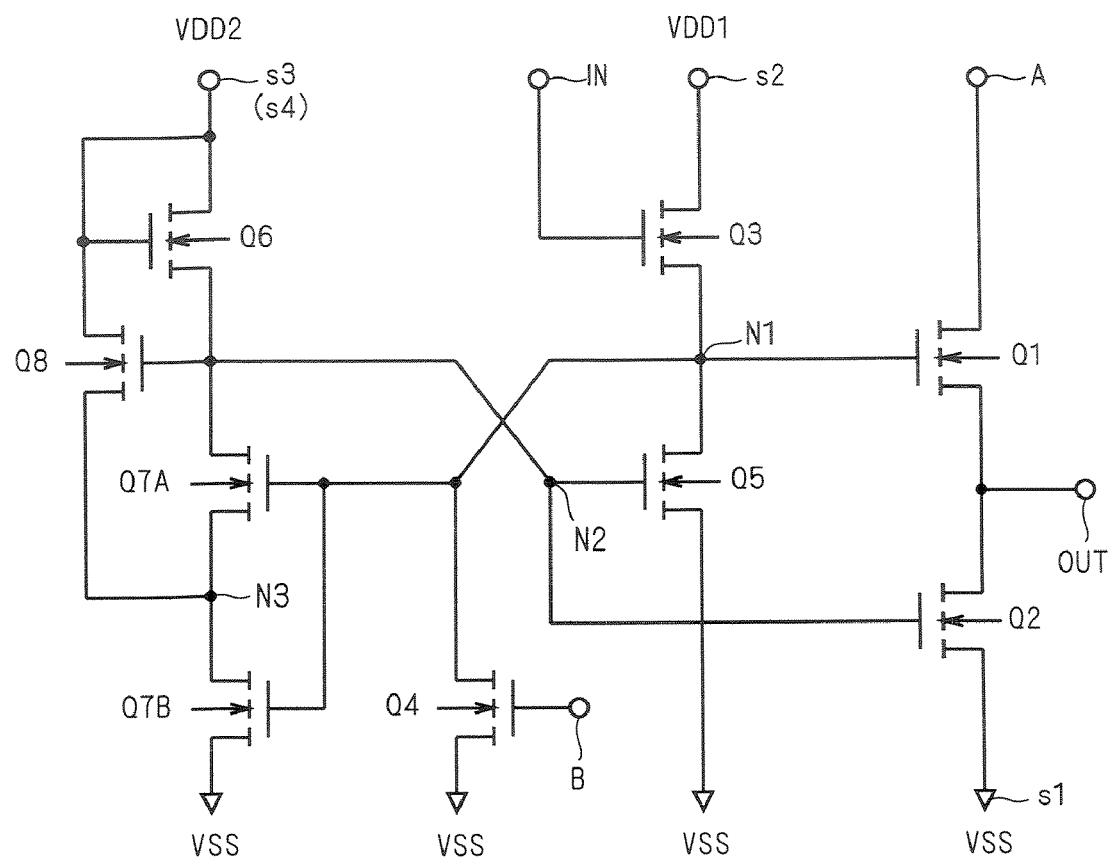
FIG. 13 is a circuit diagram illustrating the configuration of a unit shift register according to a third preferred embodiment of the invention.

FIG. 13 is a circuit diagram illustrating the configuration of a unit shift register SR according to a third preferred embodiment. While the step-up capacitor C is provided between the drain and source of the transistor Q1 in the first preferred embodiment for efficiently stepping up the node N1, it is replaced by the gate capacitance of the transistor Q1 in the present embodiment. In this case, the step-up capacitor C is not required, as shown in the circuit diagram of FIG. 13.

The insulation film to be a dielectric layer of a capacitive element formed in a semiconductor integrated circuit generally has the same thickness as a gate insulation film of a transistor. Accordingly, when replacing a capacitive element by a gate capacitance of a transistor, a transistor having the same area as the capacitive element may be used. Specifically, increasing the gate width of the transistor Q1 as necessary in FIG. 13 achieves a step-up operation equivalent to that performed by the circuit shown in FIG. 8 according to the first preferred embodiment. Further, increasing the gate width of the transistor Q1 increases its driving capability, resulting in increased rising and falling rates of the output signal, which produces another advantageous effect of achieving higher speed operation.

Fourth Preferred Embodiment

For instance, in the conventional unit shift register SR shown in FIG. 3, two transistors Q4 and Q5 are connected between the node N1 and first power terminal s1 (low supply voltage VSS). The transistor Q4 has the function mainly of discharging charges at the node N1 which is in the H level to cause the node N1 to drop to the L level, and the transistor Q5 has the function mainly of fixing the node N1 having dropped to the L level to the low supply voltage VSS.

Even when the transistor Q5 is omitted from the conventional unit shift register SR, the node N1 having dropped to the L level is only brought into the floating state, which means a theoretical operation is possible. Since omitting the transistor Q5 brings an advantage of size reduction of the apparatus, a level shift circuit configured without the transistor Q5 has been presented (aforementioned JP 2001-350438).

However, the transistor Q5 serves as a discharge path of noise at the node N1 which is in the L level. Thus, omitting the transistor Q5 will increase the influence of noise resulting from the overlap capacitance of the transistor Q1, which makes the problem of the resultant malfunction significant. The present embodiment therefore applies the present invention to a unit shift register SR configured without the transistor Q5, to thereby solve the problem.

FIG. 14 is a circuit diagram illustrating the configuration of a unit shift register SR according to a fourth preferred embodiment. As shown in the drawing, the unit shift register SR has a configuration shown in FIG. 8, but the transistor Q5 is omitted. The second preferred embodiment is also applied, whereby the transistor Q3 has its drain connected to the input terminal IN to reduce the area occupied by a wire for power supply. The third embodiment is further applied, whereby the step-up capacitor C is omitted.

As described, since the transistor Q5 serves as a discharge path of noise at the node N1 which is in the L level, variations in potential at the node N1 in the reset state are likely to be widened due to the noise resulting from the overlap capacitance of the transistor Q1, in a unit shift register SR as shown in FIG. 14 not provided with the transistor Q5. In the unit shift register SR shown in FIG. 14, however, the transistors Q6, Q7A, Q7B and Q8 constitute an inverter (pull-down driving circuit) in which the node N1 serves as an input node and the node N2 serves as an output node, as shown in FIG. 10, whose threshold voltage is high. Accordingly, the inverter is unsusceptible to the noise at the node N1 in the reset state, which prevents a malfunction caused by the noise. The present invention is therefore advantageous particularly in the unit shift register SR not provided with the transistor Q5.

Omitting a wire for power supply by applying the second preferred embodiment and omitting the step-up capacitor C by applying the third preferred embodiment as well as omitting the transistor Q5 as shown in FIG. 14 can reduce the area occupied by the unit shift register SR, which is advantageous in size reduction of the display apparatus.

Fifth Preferred Embodiment

For instance, the conventional unit shift register SR shown in FIG. 3 is in the reset state just before the input signal to the input terminal IN (start pulse or output signal $G_{n-1}$ from the immediately preceding stage) rises to the H level, at which time the transistor Q5 is on.

Therefore, as described earlier, the following steps are performed when the input terminal IN rises to the H level to cause the unit shift register SR to be changed from the reset state to the set state. That is, when the input terminal IN rises to the H level, the node N1 rises in potential in accordance with the ratio between the on-state resistances of the transistors Q3 and Q5. The transistor Q7 thereby starts conducting, causing the node N2 to drop in potential. Accordingly, the transistor Q5 further increases in resistance to cause the node N1 to further rise in potential, and the transistor Q7 is sufficiently turned on, to cause the node N2 to drop to the L level (VSS). The transistor Q5 accordingly turns off, causing the node N1 to rise to the H level (VDD1-Vth). As a result, the unit shift register SR is brought into the set state.

The unit shift register SR undergoes the above operation when changing from the reset state to the set state, and therefore requires a relatively long time for the change. This interferes with higher speed operation of the unit shift register SR, which in turn interferes with higher resolution of the display apparatus employing the unit shift register SR in the gate-line driving circuit.

A solution to the problems may be providing a transistor Q9 between the node N2 and first power terminal s1 (low supply voltage VSS) with its gate connected to the input terminal IN, as shown in FIG. 15, for example. In the circuit shown in FIG. 15, the transistor Q9 is turned on when the input terminal IN rises to the H level, causing the node N2 to drop to the L level in an instant. The transistor Q5 accordingly turns off, causing the node N1 to rise to the H level at high speed. That is, the switching from the reset state to the set state is made in an instant, which contributes to higher speed operation of the unit shift register SR.

When the unit shift register SR shown in FIG. 15 is employed in the gate-line driving circuit, however, the following problem occurs. That is, since a gate line intersects a plurality of data lines (data lines DL1, DL2, . . . shown in FIG. 1), noise is likely to be added to the gate line through the coupling induced by the parasitic capacitance between the gate line and data lines when writing data to the data lines or when the counter electrode (common electrode node NC shown in FIG. 1) is reversed in polarity. When the noise is applied to the input terminal IN through the gate line in the reset state of the unit shift register SR, a current flows in the transistor Q9 to cause the node N2 which is in the L level to drop.

Since the transistors Q2 and Q5 are in result degraded in driving capability, the unit shift register SR is likely to be affected by the noise resulting from the overlap capacitance of the transistor Q1, which causes a similar problem as the malfunction of the conventional level shift circuit described in the first preferred embodiment. Particularly when the unit shift register SR is formed of a-Si TFTs, the transistors Q2 and Q5 are degraded further in driving capability with time, causing the problem to be more significant. The present embodiment presents a unit shift register SR capable of solving the problem.

Referring again to the circuit shown in FIG. 15 and giving attention to the transistors Q6 and Q9, these transistors constitute the inverter shown in FIG. 9 in which the input terminal IN serves as an input node and the node N2 serves as an output node. The aforementioned problem of drop in potential at the node N2 due to the noise applied to the input terminal IN results from the susceptibility of the inverter to noise.

FIG. 16 is a circuit diagram illustrating the configuration of a unit shift register SR according to a fifth preferred embodiment. As shown in the drawing, the unit shift register SR includes transistors Q9A and Q9B connected in series between the node N2 and first power terminal s1 with their gates connected to the input terminal IN. Defining a connection node between the transistors Q9A and Q9B as a node N4, the transistor Q8 is connected between the node N4 and third power terminal s3 with its gate connected to the node N2. That is, the transistor Q8 is controlled to be at the potential at the node N2 to flow a feedback current from the third power terminal s3 to the node N4. Accordingly, the transistors Q6, Q8, Q9A and Q9B constitute what is called "Schmitt trigger circuit".

In other words, the unit shift register SR shown in FIG. 16 includes a first inverter formed of the transistors Q6 and Q7 in which the node N1 serves as an input node and the node N2 serves as an output node as well as a second inverter formed of the transistors Q6, Q8, Q9A and Q9B in which the input terminal IN serves as an input node and the node N2 serves as an output node (which means the first and second inverters share the transistor Q6). This second inverter is also a pull-down driving circuit (second pull-down driving circuit) which drives the transistor Q2 for pulling down the output terminal OUT. As is apparent from FIG. 16, the first inverter has the configuration shown in FIG. 9, and the second inverter has the configuration shown in FIG. 10.

In the second inverter, the transistor Q8 is on when the node N2 is at the H level, causing the source of the transistor Q9A (node N4) to be forward-biased. The transistor Q9A does not conduct until the gate becomes higher than the source in potential by the threshold voltage Vth or more. Therefore, to inverse the second inverter, the input terminal IN needs to be higher than the biased node N4 in potential by the threshold voltage Vth or more. The threshold voltage of the second inverter accordingly becomes high.

Accordingly, the second inverter formed of the transistors Q6, Q8, Q9A and Q9B is unsusceptible to the noise applied to the input terminal IN which is in the L level, which prevents the node N2 from dropping in potential resulting from the noise applied to the input terminal IN in the reset state of the unit shift register SR. Therefore, according to the present embodiment, the node N2 is switched from the L level quickly when the input terminal IN rises to the H level to thereby achieve higher speed operation of the unit shift register SR, and the malfunction caused by the noise applied to the input terminal IN can be prevented. This in result prevents a display malfunction of the display apparatus including the gate-line driving circuit formed of the unit shift registers SR according to the present embodiment.

Particularly, when the unit shift register SR is formed of a-Si TFTs, the transistors Q2 and Q5 with their gates connected to the node N2 are degraded in driving capability, causing the aforementioned problem to be likely to occur, so that the application of the present application is advantageous.

Sixth Preferred Embodiment

FIG. 17 is a circuit diagram illustrating the configuration of a unit shift register SR according to a sixth preferred embodiment. The present embodiment is implemented by combining the aforementioned first and fifth preferred embodiments. More specifically, the unit shift register SR according to the present embodiment, as shown in FIG. 17, includes a first inverter (first pull-down driving circuit) formed of the transistors Q6, Q7A, Q7B and Q8 in which the node N1 serves as an input node and the node N2 serves as an output node as well as a second inverter (second pull-down driving circuit) formed of the transistors Q6, Q8, Q9A and Q9B in which the input terminal IN serves as an input node and the node N2 serves as an output node. The first and second inverters share the transistors Q6 and Q8, which means the transistors Q9A and Q9B are connected in parallel to the transistors Q7A and Q7B. That is, in the present embodiment, the node N3 between the transistors Q7A and Q7B and the node N4 between the transistors Q9A and Q9B are the same node.

The present embodiment produces both effects achieved by the first and fifth preferred embodiments. More specifically, the node N2 is switched from the L level quickly when the input terminal IN rises to the H level to thereby achieve higher speed operation of the unit shift register SR, and the malfunction caused by the noise resulting from the overlap capacitance of the transistor Q1 or noise applied to the input terminal IN through the gate line can be prevented.

Further, configuring the shift register SR as shown in FIG. 17 such that the transistors Q6 and Q8 are shared by the first and second inverters can prevent increase in area occupied by the unit shift register SR according to the present embodiment.

While the invention has been shown and described in detail, the foregoing description is in all aspects illustrative and not restrictive. It is therefore understood that numerous modifications and variations can be devised without departing from the scope of the invention.

What is claimed is:

1. A shift register comprising:
a clock terminal and an output terminal;
a first transistor connected between said output terminal and said clock terminal;
a second transistor configured to discharge said output terminal; and
a first pull-down driving circuit in which a first node to which a control electrode of said first transistor is connected serves as an input node and a second node to which a control electrode of said second transistor is connected serves as an output node, wherein
said first pull-down driving circuit includes:
third and fourth transistors connected in series between said second node and a first power terminal;
a fifth transistor connected between said second node and a second power terminal; and
a sixth transistor controlled to be at a potential at said second node to flow a feedback current to a third node serving as a connection node between said third and fourth transistors.

2. The shift register according to claim 1, wherein
said third and fourth transistors have their control electrodes connected to said first node,
said fifth transistor has its control electrode connected to said second power terminal, and
said sixth transistor is connected between said third node and a third power terminal, and has its control electrode connected to said second node.

3. The shift register according to claim 2, wherein
said second power terminal and said third power terminal are formed of the same terminal.

4. The shift register according to claim 1, further comprising:
an input terminal to which a signal defining timing of charging said first node is input; and
a second pull-down driving circuit in which said input node serves as an input node and said second node serves as an output node, wherein
said second pull-down driving circuit includes:
seventh and eighth transistors connected in series between said second node and said first power terminal;
a ninth transistor connected between said second node and said second power terminal; and
a tenth transistor controlled to be at a potential at said second node to flow a feedback current to a fourth node serving as a connection node between said seventh and eighth transistors.

5. The shift register according to claim 4, wherein
said seventh transistor and said eighth transistor have their control electrodes connected to said input terminal,
said ninth transistor has its control electrode connected to said second power terminal, and
said tenth transistor is connected between said fourth node and a third power terminal, and has its control electrode connected to said second node.

6. The shift register according to claim 4, wherein
said fifth and ninth transistors are formed of the same transistor, and
said sixth and tenth transistors are formed of the same transistor.

7. The shift register according to claim 5, wherein
said second and third power terminals are formed of the same terminal.

8. The shift register according to claim 1, further comprising
a capacitive element connected between said first node and said output terminal.

9. A shift register comprising a plurality of shift registers connected in cascade, each being defined in claim 1.

10. An image display apparatus comprising a gate-line driving circuit formed of a plurality of shift registers connected in cascade, wherein
each of said plurality of shift registers includes:
a clock terminal and an output terminal;
a first transistor connected between said output terminal and said clock terminal;
a second transistor configured to discharge said output terminal; and a first pull-down driving circuit in which a first node to which a control electrode of said first transistor is connected serves as an input terminal and a second node to which a control electrode of said second transistor is connected serves as an output terminal, wherein said first pull-down driving circuit includes:

third and fourth transistors connected in series between said second node and a first power terminal;

a fifth transistor connected between said second node and a second power terminal; and a sixth transistor controlled to be at a potential at said second node to flow a feedback current to a third node serving as a connection node between said third and fourth transistors.

11. A shift register comprising:

a clock terminal and an output terminal;

a first transistor connected between said output terminal and said clock terminal;

a second transistor configured to discharge said output terminal;

an input terminal to which a signal defining timing of charging a first node to which a control electrode of said first transistor is connected; and a pull-down driving circuit in which said input terminal serves as an input terminal and a second node to which a control electrode of said second transistor is connected serves as an output terminal, wherein said pull-down driving circuit includes:

third and fourth transistors connected in series between said second node and a first power terminal;

a fifth transistor connected between said second node and a second power terminal; and a sixth transistor controlled to be at a potential at said second node to flow a feedback current to a third node serving as a connection node between said third and fourth transistors.

12. The shift register according to claim 11, wherein said third and fourth transistors have their control electrodes connected to said input terminal, said fifth transistor has its control electrode connected to said second power terminal, and said sixth transistor is connected between said third node and a third power terminal, and has its control electrode connected to said second node.

13. The shift register according to claim 12, wherein said second and third power terminals are formed of the same terminal.

14. The shift register according to claim 11, further comprising a capacitive element connected between said first node and said output terminal.

15. A shift register comprising a plurality of shift registers connected in cascade, each being defined in claim 11.

16. An image display apparatus comprising a gate-line driving circuit formed of a plurality of shift registers connected in cascade, wherein each of said plurality of shift registers includes:

a clock terminal and an output terminal;

a first transistor connected between said output terminal and said clock terminal;

a second transistor configured to discharge said output terminal;

an input terminal to which a signal defining timing of charging a first node to which a control electrode of said first transistor is connected; and a pull-down driving circuit in which a first node to which a control electrode of said first transistor is connected serves as an input terminal and a second node to which a control electrode of said second transistor is connected serves as an output terminal, wherein said pull-down driving circuit includes:

third and fourth transistors connected in series between said second node and a first power terminal;

a fifth transistor connected between said second node and a second power terminal; and a sixth transistor controlled to be at a potential at said second node to flow a feedback current to a third node serving as a connection node between said third and fourth transistors.

* * * * *